United States Patent [19]

Plaessmann et al.

[11] Patent Number: 5,546,222
[45] Date of Patent: Aug. 13, 1996

[54] MULTI-PASS LIGHT AMPLIFIER

[75] Inventors: Henry Plaessmann, Pacifica; William M. Grossman, Los Altos; Todd E. Olson, Palo Alto, all of Calif.

[73] Assignee: Lightwave Electronics Corporation, Mountain View, Calif.

[21] Appl. No.: 79,640

[22] Filed: Jun. 18, 1993

Related U.S. Application Data

[63] Continuation-in-part of Ser. No. 979,576, Nov. 18, 1992.

[51] Int. Cl.$^6$ ............................ H01S 3/091; H01S 3/08
[52] U.S. Cl. ........................ 359/346; 359/347; 372/95
[58] Field of Search ................................ 359/337, 346, 359/347; 372/72, 95, 108

[56] References Cited

U.S. PATENT DOCUMENTS

| | | | |
|---|---|---|---|
| 3,748,014 | 7/1973 | Belser | 356/112 |
| 4,360,925 | 11/1982 | Brosnan et al. | 372/95 |
| 4,368,986 | 1/1983 | Bennett | 356/445 |
| 4,422,046 | 12/1983 | Mumola et al. | 359/346 |
| 4,785,459 | 11/1988 | Baer | 372/75 |
| 4,894,839 | 1/1990 | Baer | 372/93 |
| 4,908,832 | 3/1990 | Baer | 372/75 |
| 4,951,294 | 8/1990 | Basu et al. | 372/93 |
| 5,103,457 | 4/1992 | Wallace | 372/92 |
| 5,307,358 | 4/1994 | Scheps et al. | 372/108 |

OTHER PUBLICATIONS

Streifer et al., "Phased array diode lasers," *Laser Focus/Electro-Optics*, Jun. 1984, pp. 100–109.
Fan et al., "Diode Laser–Pumped Solid–State Lasers," *IEEE Journal of Quantum Electronics*, vol. 24, 1988, pp. 895–912.
Keyes et al. "Injection luminescent pumping of $CaF_2:U^{3+}$ with GaAs diode laser," *Applied Physics Letters*, vol. 4, 1964, pp. 50–52.
Ross, "YAG Laser Operation by Semiconductor Laser Pumping," *Proceedings of the IEEE*, vol. 56, 1968, pp. 196–197.
Rosenkarntz, "GaAs diode–pumped Nd:YAG laser," *Journal of Applied Physics*, vol. 43, 1972, pp. 4603–4605.

(List continued on next page.)

*Primary Examiner*—Nelson Moskowitz

[57] ABSTRACT

A multiple-pass laser amplifier that uses optical focusing between subsequent passes through a single gain medium so that a reproducibly stable beam size is achieved within the gain region. A resonator or a White Cell cavity is provided, including two or more mirrors (planar or curvilinearly shaped) facing each other along a resonator axis and an optical gain medium positioned on a resonator axis between the mirrors or adjacent to one of the mirrors. In a first embodiment, two curvilinear mirrors, which may include adjacent lenses, are configured so that a light beam passing through the gain medium and incident on the first mirror is reflected by that mirror toward the second mirror in a direction approximately parallel to the resonator axis. A light beam translator, such as an optical flat of transparent material, is positioned to translate this light beam by a controllable amount toward or away from the resonator axis for each pass of the light beam through the translator. A second embodiment uses two curvilinear mirrors and one planar mirror, with a gain medium positioned in the optical path between each curvilinear mirror and the planar mirror. A third embodiment uses two curvilinear mirrors and two planar mirrors, with a gain medium positioned adjacent to a planar mirror. A fourth embodiment uses a curvilinear mirror and three planar mirrors, with a gain medium positioned adjacent to a planar mirror. A fourth embodiment uses four planar mirrors and a focusing lens system, with a gain medium positioned between the four mirrors. A fifth embodiment uses first and second planar mirrors, a focusing lens system and a third mirror that may be planar or curvilinear, with a gain medium positioned adjacent to the third mirror. A sixth embodiment uses two planar mirrors and a curvilinear mirror and a fourth mirror that may be planar or curvilinear, with a gain medium positioned adjacent to the fourth mirror. In a seventh embodiment, first and second mirrors face a third mirror, all curvilinear, in a White Cell configuration, and a gain medium is positioned adjacent to one of the mirrors.

84 Claims, 11 Drawing Sheets

OTHER PUBLICATIONS

Kubodera et al, "Pure single-mode LiNdP$_4$O$_{12}$ solid-state laser transmitter for 1.3-μm fiber optic communications," *Applied Optics.* vol. 21, 1982, pp. 3466–3469.

Sipes, "Highly efficient neodymium:yttrium aluminum garnet laser end pumped by a semiconductor laser array," *Applied Physics Letters,* vol. 47, 1985, pp. 74–76.

Minelly, "Laser–diode–pumped neodymium–doped fiber laser with output power>1W," Paper CWE6, Digest of Technical Papers, Conference on Lasers and Electro–optics, 1992, pp. 246, 247, 249.

Coyle, "Design of a High–Gain Laser Diode–Array Pumped Nd:YAG Alternating Precessive Slab Amplifier (APT Amplifier)," *IEEE Journal of Quantum Electroncs,* vol. 27, 1991, pp.2327–2331.

Sandoval, "Angular multiplexing as a technique for short–pulse amplification in a high-gan xenon amplifier," *Journal of Applied Physics,* vol. 49, 1978, pp. 5745–5749.

Grossman et al., "Axisymmetric Angular Encoder for Laser Fusion," *IEEE Journal of Quantum Electronics,* vol. QE–17, 1981, pp. 1870–1878.

Trutna et al., "Multiple-pass Raman gain cell," *Applied Optics,* vol. 19, 1980, pp. 301–312.

Tidwell et al., "Scaling CW Diode–End–Pumped Nd:YAG Lasers to High Average Powers," *IEEE Journal of Quantum Electronics,* vol. 28, 1992, pp. 997–1009.

Baer, "Performance of Diode–Pumped Nd:YAG and Nd:YLF Lasers in a Tightly Folded Resonator Configuration," *IEEE Journal of Quantum Electronics,* vol. 28, 1992, pp. 1131–1138.

Khoroshilov et al., "10kHz-Rate Amplification of 40–fs Optical Pulses at Low Pumping Energy," *Ultrafast Phenomena* VI (Springer Verlag, Berlin, 1988), pp. 22–23.

Georges et al., "High–efficiency multipass Ti:sapphire amplifiers for a continuous–wave single–mode laser," *Optics Letters.* vol. 16, 1991, pp. 144–146.

White, "Long Optical Paths of Large Aperture," *Journal of the Optical Society of America,* vol. 32, 1942, 285–288.

Kogelnik et al., "Laser Beams and Resonators," *Proceedings of the IEEE,* vol. 54, 1966, pp. 1312–1329.

Fork et al., "Multipass optical amplifier using a double confocal resonator geometry," *Revue Physique Applique,* vol. 22, 1987, pp. 1665–1771.

Plaessman et al., "Reducing Puilse Durations in Diode Pumped Qswitched Solid–State Lasers," IEEE Photonics Technology Letters, vol. 3, 1991, pp. 885–887.

Fork et al, Rev. Phys. Appl. (France), vol. 22, #12, pp. 1665–1671; Dec. 1987; abst. only supplied herewith.

Plaessmann et al, IEEE Photonics Technol. Lett., vol. 3, #10, pp 885–887, Oct. 1991; abst. only herewith.

Gerstenberger et al, CLRO–88, vol. 7, Apr. 29, 1988, pp. 296, 298: abst. only herewith.

Grossman et al, IEEE J. Quant. Elec., vol. QE–17, #9, pp. 1870–1878, Sep. 1981; abst. only herewith.

Fork et al, Opt. Lett., vol. 14, #19, pp. 1068–1070, Oct 1, 1989; abst only herewith.

Becker et al, Opt. Lett., vol. 16, #26, pp. 1847–1849, Dec. 1, 1991; abst. only herewith.

Plaessmann et al, Opt. Lett., vol. 18, #17, pp. 1420–1422, Sep. 1, 1993; abst. only herewith.

Olson et al, IEEE Photonics Technol. Lett., vol. 6, #5, pp. 605–608, May 1994: abst. only herewith.

MULTI-PASS LIGHT AMPLIFIER

This work was performed under NASA Contract No. NAS 7-1145. The U.S. Government has rights in this invention.

This is a continuation-in-part of a patent application U.S. Ser. No. 07/979,576, filed 18 Nov. 1992.

FIELD OF THE INVENTION

The invention relates generally to lasers and more particularly to amplification of optical power by laser gain media.

BACKGROUND OR THE INVENTION

Lasers and laser amplifiers can be energized by many different means and may use many different laser media. Of special interest here are laser amplifiers energized or "pumped" by laser diodes. For a review of laser diode pumped solid-state lasers see T. Y. Fan and R. L. Byer, "Diode laser-pumped solid-state lasers", I.E.E.E. Jour. of Quant. Elec., vol. 24 (1988) pp. 895–912. Here the term "solid-state lasers" includes all lasers, except semiconductor laser diodes (referred to as "laser diodes"), in which the laser gain medium is a solid-state material. Original work in laser diodes, and a laser diode's applicability to pumping of solid-state lasers, is discussed by W. Streifer et al, "Phased array diode lasers", Laser Focus/Electro-optics, June 1984, pp. 100–109, by R. J. Keys and T. M. Quist, "Injection luminescent pumping of $CaF_2:U^{3+}$ with GaAs diode lasers", Appl. Phys. Lett., vol. 4 (1963) pp. 50–52, and by M. Ross, "YAG laser operation by semiconductor laser pumping", Proc. I.E.E.E., vol. 56 (1968) pp. 196–197. New high power laser diodes can be used for laser diode pumping. However, the pump light must overlap the mode of the solid-state laser to obtain efficient laser operation, and a good geometry for doing this is end-pumping. These are discussed by L. J. Rosencrantz, "GaAs diode-pumped Nd:YAG laser", Jour. Appl. Phys., vol. 43 (1973) pp. 4603–4605, by K. Kubodera and J. Noda, "Pure single mode $LiNdP_4O_{12}$ solid-state laser transmitter for 1.3 µm fiber-optic communications", Appl. Optics, vol. 21 (1982) pp. 3466–3469, and by D. L. Sipes, "Highly efficient neodymium:yttrium aluminum garnet laser end pumped by a semiconductor laser array", Appl. Phys. Lett., vol. 47 (1985) pp. 74–76.

Thermal lensing in the laser gain media can perturb the laser or amplifier optics and degrade the mode overlap in the media. In addition, light from higher power laser diodes is often far from diffraction limited; such light does not appear in a single transverse spatial mode. Work has been applied toward designing solid-state laser cavities and optics that transfer diode light so that the pump light and the solid-state laser mode efficiently overlap in the laser gain medium.

For many applications increased laser power is useful. One way to increase power is to make a more powerful laser oscillator. But, as with electronic oscillators, it is often easier to obtain desired characteristics from a small, well-controlled laser oscillator, and then amplify the oscillator's output to obtain higher powers. Amplifiers potentially can scale short-pulse or frequency-stable laser oscillators to high power.

Laser amplifiers can increase optical power and are as old as lasers themselves. Linear amplifiers, fiber amplifiers, and multi-pass amplifiers have been built, and are discussed in the references cited below. However, much of the work on amplifiers using diode-pump sources has been on two categories of amplifiers. The first is diode-pumped fiber amplifiers for communications applications. Fiber amplifiers have tremendous utility as low-noise high-gain amplifiers, but they are not ideally suited for use in high peak or average power applications because the fiber may damage, and it is difficult to pump single-transverse-mode fiber with high power diodes that are not themselves single transverse mode. See J. D. Minelly et al, "Laser diode-pumped neodymium-doped fiber laser with output power>1 W", paper CWE6, Conference on Lasers and Electro-optics, 1992, Digest of Technical Papers, Opt. Soc. of America, Washington, D.C., for a particular approach to this problem. The second category of amplifier is single- or double-pass amplifiers where for efficiency the input must be energetic enough to saturate the amplifier. These amplifiers in the master oscillator/power amplifier configuration are technologically very important. However, these lasers are not generally optimized for large gain, but rather for high power, high energy, and high extraction efficiency. One example of an amplifier that does not fall directly into the two broad categories above is the tightly folded amplifier or resonator disclosed by T. M. Baer in U.S. Pat. Nos. 4,785,459, 4,894,839 and 4,908,832. Another example is a precessing slab amplifier discussed by D. B. Coyle, "Design of a high gain laser diode array-pumped Nd:YAG alternating precessive slab amplifier", I.E.E.E. Jour. Quant Elec., vol. 27 (1991) pp. 2327–2331.

R. P. Sandoval, in "Angular multiplexing as a technique for short-pulse amplification in a high gain xenon amplifier", Jour. Appl. Phys., vol. 49 (1978) pp. 5745–5749, notes that passing a sequence of light beams through the same volume of an amplifier but at different angles will amplify short pulses, if a significant fraction of the available energy is extracted with each pass and if amplified spontaneous emission is suppressed. W. M. Grossman et al, in "Axisymmetric angular encoder for laser fusion", I.E.E.E. Jour. Quant. Elec., vol. QE-17 (1981) pp. 1870–1878, disclose use of a multi-pass refocusing ring laser amplifier, which is only marginally stable when operating as an oscillator, using angle mutiplexing; the optical ring is purposely misaligned relative to the injected beam. W. R. Trutna and R. L. Byer, in "Multiple-pass Raman gain cell", Appl. Optics, vol. 19 (1980) pp. 301–312, describe use of a stable resonator for multi-pass amplification of Raman radiation, using angle multiplexing; the successive light beams do not pass through a single point in the gain medium.

Even with higher power laser diode sources, the efficient end-pumped configuration is commonly believed to limit the amount of energy that can be used (as stated by Baer, Welford et al, and Tidwell et al; see the citations in this patent), thereby limiting the power of the laser, since the power densities in the pump region of the gain medium become too high and the heat produced cannot be removed. One difficulty encountered with large heat deposition in oscillators is that heat flow results in thermal lensing and aberrations in the laser gain medium and can also lead to thermal birefringence and thermal fracture and loss of efficiency. Thermal lensing is inherent in high power side-pumped or end-pumped lasers. One technique to reduce thermal aberrations in resonators is to apply compensating optics as suggested by S. C. Tidwell et al, "Scaling CW diode end-pumped Nd:YAG lasers to high average powers", I.E.E.E. Jour. Quant Elec., vol. 28 (1992) pp. 997–1009.

Another approach is to design a laser cavity with an elliptical optical mode shape as suggested by R. W. Wallace et al, "Elliptical Mode Cavities for Solid-state Lasers Pumped by Laser Diodes", U.S. Pat. No. 5,103,457. Use of an elliptical mode, rather than a circular mode, aids in heat transfer and helps match the cavity mode to the shape of the pumped volume provided by some higher power laser diode sources. However, in diode-pumped amplifiers to date, avoiding the effects of thermal focusing and thermal aberrations has not been adequately addressed. The subject invention discloses a technique for efficient laser amplification that can give high gain and high efficiency with reduced sensitivity to thermal lensing in the laser amplifier media. This technique can accept end-pumped or side-pumped geometries and is not restricted to use of laser diode pumps for laser gain medium pumping.

Some side-pumped diode-pumped amplifiers and variations on end-pumped diode-pumped amplifiers have been built. In these amplifiers the ability to produce high gain is still impaired by thermal lensing. In T. M. Baer et al, "Performance of diode pumped Nd:YAG and Nd:YLF lasers in a tightly folded resonator configuration", I.E.E.E.Jour. Quant Elec., vol. 28 (1992) pp. 1131–1138, the authors state that the tightly folded design is difficult to use due to thermal lensing, when using the important laser medium, Nd:YAG. The subject invention produces greater gain with less pump power.

The geometry of the subject invention bears some resemblance to the earlier work of E. V. Khoroshilov et al, "10 kHz-Rate Amplification of 40-fs Optical Pulses at Low Pumping Energy", Springer Series in Chemical Physics, vol. 48, *Ultrafast Phenomena VI*, Springer Verlag, Berlin/Heidelberg, 1988, pp. 22–23 and the work of P. Georges et al, "High efficiency multi-pass Ti:sapphire amplifiers for a continuous-wave single-mode laser", Optics Lett., vol. 16 (1991) pp. 144–146. However, the designs of these workers are fundamentally different in both implementation and effect from those of the subject invention. Khoroshilov et. al. and Georges et al use amplifier cells where a laser beam is multiply passed through a gain medium, and the beam is refocused between passes of the amplifier, as shown in FIG. 1. This geometry employs two mirrors that are ideally paraboloidal and of differing focal lengths deployed around the gain medium, with the mirrors positioned to have common foci and the gain medium being located at the common foci of the mirrors.

FIG. 1 illustrates a design disclosed by Georges et al, ibid. An optical amplifier cell 1.30 shown in FIG. 1 has a laser gain medium 101 of Ti:sapphire and has a central or resonator axis 104. A frequency doubled Nd:YAG laser beam 102 pumps the gain medium 101. The central axis 104 of the cell 130 passes through the gain medium 101. The path of a light beam passes through the gain medium 101 and is translated downward as a result of passing through two Brewster angle faces of the gain medium. A light beam 112 is introduced into the cell 130 parallel to, but offset by a distance d from, the central axis 104 of the cell, which axis is also the central axis of the pump bean 102. The input or probe beam 112 to be amplified passes through an aperture or hole in an inwardly facing paraboloidal or spherical mirror 105 of focal length $F_1$. The beam 112 then passes outside the gain medium 101, where the beam is later amplified, and develops a beam waist in a transverse plane 107 that contains the mirror foci. This beam waist occurs because of beam tailoring optics external to the amplifier that are supplied by the user, a standard design problem for those skilled in optics.

The light beam 112 is incident on a paraboloidal or spherical mirror 106 of focal length $F_2$, where $F_2 < F_1$ so that the mirrors have unequal focal lengths. The beam 112 is reflected from the mirror 106 as a light beam 113 through the gain medium 101 to form another beam waist in the gain medium. An amplified light beam 114 passes out of the gain medium 101 and is incident upon and reflects from the mirror 105. The resulting reflected beam 115 propagates parallel to the central axis 104 of the cell, but offset from this axis by a distance of $d(F_1/F_2)$, which is greater than d. The beam 115 passes outside the gain 101 and develops a beam waist in the plane 107 of the beam foci. The beam 115 is then incident upon the mirror 106. The light beam 115 is reflected as a light beam 116 and proceeds toward the gain medium 101, where this beam is amplified as a light beam 117, and continues toward the mirror 105 and is reflected as a light beam 118. The light beam 118 approaches and is reflected from the mirror 106 as a light beam 119. The light beam 119 passes to another waist in the gain medium 101, where the beam is further amplified as a light beam 120. The beam 120 propagates parallel to the central axis 104 of the cell, but offset from it by a distance $d_{offset}$ of:

$$d_{offset} = d(F_1/F_2)^2. \quad (1)$$

The beam is sequentially amplified and displaced from the central axis 104 in a geometric progression of displacements. After sufficient amplification the beam is extracted from the amplifier cell 130 by a mirror 108 to, produce a light beam output 109. If the mirror 108 is moved away from the central axis 104, the number of passes the beam makes within the amplifier cell is increased, if the mirrors 105 and 106 have sufficiently large diameters. The difference $\Delta_n$ in the offset distance between adjacent beams on the same side of the central axis 104, separated by two consecutive beam passes through the gain medium 101, is $$\Delta_n = d[(F_1/F_2)^{n+2} - (F_1/F_2)^n], \quad (2)$$

where n is the number of passes of the light beam through the gain medium 101 for the earlier beam. Each time a light beam is displaced to a leg further removed from the central axis 103, the beam diameter at the waist in the collimated leg is also magnified by the ratio $F_1/F_2$, and in the next pass of the beam through the gain medium the beam waist is demagnified by the inverse ratio: $F_2/F_1$. In many situations this apparatus would produce superior results, if the beam diameter did not geometrically vary in this way, but rather was fixed at approximately the diameter of the pumped region of the gain medium 101. Mismatching the diameters of the light beam and the pumped region of the gain medium results in inefficient energy extraction and/or reduction of gain.

Optimally, the ratio $F_1/F_2$ and the input beam waist radius are chosen so that the beam waists in the gain medium 101 on the later passes of the cell fill the pumped region of the cell in order to get useful energy extraction. Also the ratio $F_1/F_2$ and the input beam waist radius need to be chosen so that the difference in the offset between adjacent beams on the same side of the central axis, given by Equation (2), is greater than about 2.5 beam diameters, to avoid clipping the beam and producing diffractive losses when the beam passes a sharp edge. In the geometry of FIG. 1, m optional mirror 110 and lens 111 are positioned to reflect unabsorbed pump light back through the gain medium 101, to maximize the absorption of the pump light. The fact that the light beam diameter increases geometrically after each pass through the amplifier cell 130 in the design of Georges et al shown in FIG. 1 makes it harder to achieve a large number of passes through the gain medium 101, because the beam radius rapidly becomes too large for the radii of the mirrors 105 and 106. The progression of beam diameters and locations, 121, 122, 123, 124 (not drawn to scale in FIG. 1) indicates how the beam diameters grow as the beam is translated outward from the central axis 104 of the amplifier cell 130.

LeBlanc et al, in "Compact and efficient multipass Ti:sapphire system . . . ", Optics Letters, vol. 18 (1993) pp. 140–142, discuss an eight-pass amplifier for femtosecond-length, chirped-pulse amplification in which the first four beam passes occur in a first plane and the second four beam passes occur in a parallel plane. This is a self-imaging system, but several mirrors are used for only a single reflection so that the system requires many mirrors and is quite complex.

Many techniques are available to amplify light, but such techniques are often restricted in their uses and cannot be used for several formats such as cw, Q-switched pulses, or mode-locked pulses. What is needed is a laser amplifier that is efficient, simple and cost-effective and offers high gain. Preferably, the apparatus should be able to amplify a beam with a Gaussian or near-Gaussian profile without profile degradation. Preferably, the amplifier geometry should have reduced sensitivity to thermal lensing and should accept a wide range of pumping mechanisms, including laser diode pumping.

SUMMARY OF THE INVENTION

These needs are met by the invention, which provides light amplifier apparatus using an optical resonator including two or more mirrors facing each other on opposite sides of a common focal plane. The invention places a laser gain medium within a multi-pass cell to form a multi-pass amplifier that has high efficiency and high small-signal gain. In a first embodiment, two mirrors are arranged so that a light beam that passes through a common focal point is subsequently received by one of the mirrors and reflected toward the other mirror so that the reflected light beam moves approximately parallel to a selected resonator axis. The apparatus includes an optical gain medium positioned at the common focal point and provides a light beam translator of optically transparent material. The translator receives and passes a light beam travelling approximately parallel to the selected resonator axis. The light beam that issues from the translator is again approximately parallel to the resonator axis but is translated a small, controllable amount toward or away from the resonator axis. The resonator can be a confocal resonator or can be a White Cell, as discussed below.

In another embodiment, the cell is a confocal, optically stable resonator for internal refocusing but is configured in a multiple-pass geometry. Inclusion of a light beam translator in the apparatus allows use of non-overlapping beam paths, with the exception of a region surrounding the laser gain medium. The apparatus also includes means to introduce a light beam into, or remove a light beam from, the amplifier cell.

In one group of embodiments, the light beam is reflected from each of a plurality of N>2 reflective surfaces or mirrors before the beam is reflected from any mirror a second time. In a second group of embodiments, the light beam is reflected from at least one mirror a second time before the beam is reflected from at least one of the mirrors a second time. The reflective surfaces or mirrors may be planar or curvilinearly shaped. The systems are self-imaging at the gain medium, and the image has approximately the same size for each pass through the gain medium. The system uses relatively few reflective surfaces, as few as 2–5 in the preferred embodiments, and compensation for thermal lensing is available.

BRIEF DESCRIPTION OF THE DRAWINGS

FIG. 6A illustrates a laser gain medium/mirror combination used in FIG. 6.

DESCRIPTION OF PREFERRED EMBODIMENTS OF THE INVENTION

The invention in the preferred embodiment is a multi-pass laser amplifier cell that has optical focusing and beam apodizing properties for the beam under amplification similar to, but distinct from, a "stable resonator", in the terminology of A. E. Siegman, *Lasers*, University Science Books, Mill Valley, Calif., 1986, pp. 744–756. The beam profile varies little in successive passes through the amplifier, given the proper input profile. The configuration is similar to that of a resonator in that the beam is reflected from each mirror (except the beam insertion or beam removal mirror) several times. However, the beam differs from a stable oscillator beam in that this beam follows a non-reproducing path that is ultimately steered out of the cell after amplification. "Confocal" means the amplifier is configured with mirrors, or equivalent optics, where the foci of all these opposing focusing mirrors lie in a midplane between these mirrors, and the mirrors do not necessarily have equal focal lengths. Mirrors of this sort can be replaced by lens-mirror combinations with equivalent powers without changing the design concept, and the design may also be folded by use of reflective flat mirrors. In a preferred embodiment the amplifier gain medium is diode end-pumped. However, the basic amplifier concept is neither restricted to diode pumping nor to solid-state gain medium, and the amplifier may be end-pumped or side-pumped. End pumping typically produces higher efficiency. Side pumping affords the possibility of spreading greater pump power over a longer gain material, which can help reduce the threat of thermal fracture.

Figure 2:
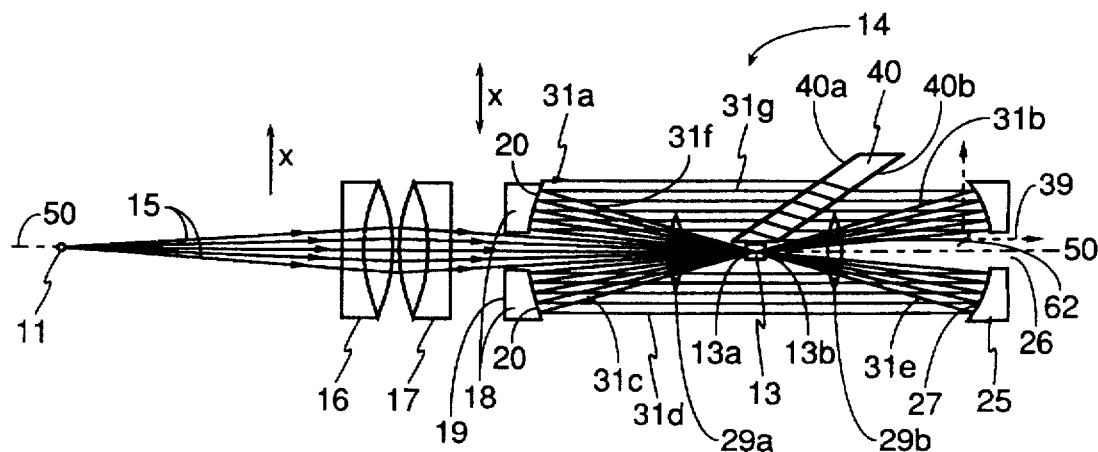
FIG. 2 illustrates an embodiment of this invention, including a laser diode end-pumped solid-state gain medium within a multi-pass cell that serves as a confocal resonator. A Brewster angle glass plate causes the beam to take a different path on each pass of the gain medium.
Figure 3:
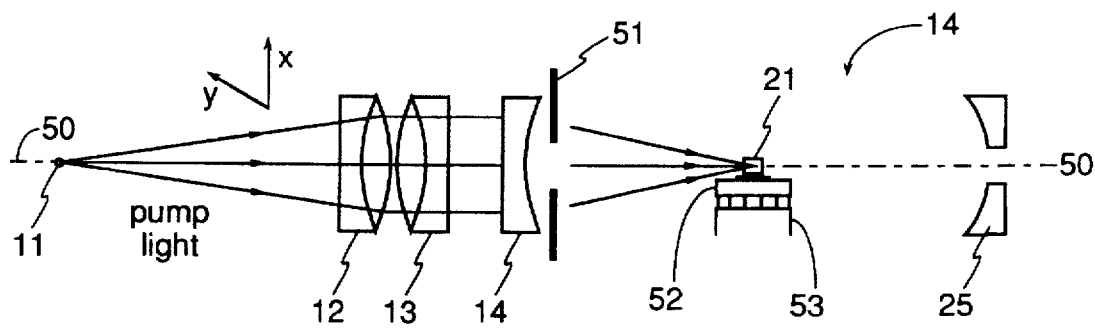
FIG. 3 is a side view of the amplifier design shown in FIG. 2, with a light beam aperture included.

The amplifier apparatus of our invention, shown in FIGS. 2 and 3 in one embodiment, maintains a near-constant spot size over many passes in the amplifier gain medium, which is important in allowing an arbitrarily large number of passes through the gain medium. This also allows the beam to fill the gain region fully and the gain profile effectively filters the beam after each pass making the amplifier less sensitive to alignment and producing good transverse profile output.

In the preferred embodiment shown in FIGS. 2 and 3, a light source 11 pumps a gain medium 13 positioned inside an optical resonator that is part of an amplifier cell 14. The source 11 may be any optical pump. A preferred pump is one or more laser diodes, or the tailored beam from one or more laser diodes sent using lenses, mirrors, prisms, fibers or other standard optical components to the light source 11. In one of our particular tests we use a laser diode with an 1 by 200 µm light-emitting region. A 200 m diameter cylindrical lens collimates the diode fight in the widely diverging dimension which is perpendicular to the plane of the diode junction and perpendicular to the long dimension of the light source. A light beam 15 from the source 11 is imaged by a pair of achromatic lenses, 16 and 17 to focus in the laser gain medium 13 which may be a solid-state material, such as Nd:YLF, but need not be crystalline. Similarly, many diode pump light imaging systems may be used and the amplifier concepts are not restricted to one-to-one imaging or to use of achromatic lenses. The pump light first passes through a first mirror 18, with light-receiving surfaces 19 and 20 that have high transmission coatings at the laser dime or pump wavelength (for example, $\lambda p=798$ nm), and the coating on surface 20 is highly reflecting at the wavelength $\lambda_L$ of the laser light being amplified (the "laser" wavelength). A first surface 13a of the laser gain medium 13 is highly transmissive for both the laser diode wavelength $\lambda P$ and the laser wavelength $\lambda_L$ and the surface 13a of the gain medium is highly transmissive for incident fight at the laser wavelength $\lambda_L$. A second gain medium surface 13b might be chosen to be reflective for the diode wavelength $\lambda p$ to recapture some of the diode light not absorbed in passing through the laser gain medium 13. However, the second surface 13b preferably has an antireflection coating for incident light at both the diode and laser wavelengths. This choice of antireflection coating also allows the laser medium to be optionally pumped from both sides.

The laser gain medium 13 is held in a thermally conductive housing, shown in FIG. 3 with a heat spreader 52 attached to a cooler 53, that allows heat to flow from the laser gain medium on one or more sides of the gain medium when the medium is absorbing waste heat generated during pumping. A transparent plate 40, appearing in FIG. 2 and discussed below, is not shown in FIG. 3, for purposes of clarity.

A second mirror 25 in FIG. 2 faces the first mirror 18 and has a coated surface 27 that is highly reflective to the laser light. An aperture 26 is placed in the second mirror 25 to allow the light beam 39 after amplification to subsequently pass out of the amplifier cell 14 after N cycles through the cell (N=1, 2, ... ). Alternatively, the light beam path through this multi-pass cell is reversible: the beam can enter instead of exit at the aperture 26 in the second mirror 25, and it is sometimes slightly easier to align the light beam to enter the optical resonator 14 through the aperture.

An input light beam 31 a enters the amplifier cell or resonator 14 by passing, or passing through an aperture in, the first mirror 18 parallel to a central or resonator axis 50 of the amplifier cell and the pump optics. The input beam 31 a passes through a glass plate or similar transparent medium 40 having two substantially parallel, planar, light-receiving surfaces 40a and 40b. The surfaces 40a and 40b of the plate 40 are polished and are oriented at the Brewster angle for the plate material relative to the propagation direction of the beam 31a. Thus, when the input light beam 31a is properly polarized in the plane of FIG. 2, there is practically no energy loss at either surface 40a or 40b of the plate 40. As a result of passing through the plate 40, the input beam 31a is laterally displaced toward (or away from) the laser gain medium 13 and the central axis 50 by a transverse displacement distance $\Delta s$ given by $$\Delta s = t(n_2/n_1 \cdot n_1/n_2)n_1/(n_1^2+n_2^2)^{1/2}, \qquad (3)$$

where t is the plate thickness and $n_1$ and $n_2$ are the refractive indices of the ambient medium within the cell and of the plate material, respectively.

The thickness t of the plate 40 is chosen so that the transverse displacement distance $\Delta s$ of the light beam is typically 2.5 beam diameters so that the beams do not overlap upon consecutive passes through the cell in the plane where a light beam is eventually removed. The beam 31a is reflected as a beam 31b from the second mirror 25, and the beam 31b is directed along a path that passes through the laser gain medium 13, with a beam waist diameter at the gain medium chosen to approximately equal the diameter of the pumped volume in the gain medium. The beam 31b passes through the laser gain medium 13 and emerges as an amplified beam 31c, and this light beam approaches and is reflected from the first mirror surface 18. A reflected and redirected beam 31d then propagates parallel to the central axis 50 until this beam is reflected from the second mirror 25 as a light beam 31e. The reflected and redirected beam 31e is focused and passes through the laser gain medium 13, with a beam waist diameter that is nearly equal to its diameter the last time the beam passed through the gain medium. An amplified light beam 31f emerges from the laser gain medium 13.

After this second amplification, the resulting beam 31f passes from the laser gain medium 13 to the first mirror 18, where the beam is reflected and becomes a light beam 31g. The reflected and redirected beam 31g then propagates parallel to the central axis 50 and is again transversely displaced by passage through the plate 40. The light beam 31g and its successors continue to pass through the cell, being displaced inward (or outward) with each pass through the plate 40. When a light beam traveling the indicated path within the resonator has been displaced transversely inward (or outward) a sufficient distance, the light beam exits the from amplifier cell 14 through an aperture 26 in (or past the edge of) the second mirror 25.

Pump power dissipated at the laser gain medium 13 generally creates a thermal lens through heating of the medium. The pair of mirrors 18 and 25 (preferably of paraboloidal or spheroidal shapes) re-image a light beam passing through the gain medium 13 back through the gain medium with approximately unity magnification. In the presence of a thermal lens within the gain medium 13, this beam re-imaging still occurs, and the beam radius does not change in the laser gain medium from one pass to the next pass. This de-emphasizes the sensitivity of beam extraction efficiency to thermal lensing, one of the objectives of the invention. However, with thermal lensing present, the beam waist location and waist diameter do change. This change can cause the beam diameter to become too large in some places, resulting in unwanted beam aperturing and losses.

Development of a thermal lens can be compensated for, and these losses can be minimized or avoided. One means to achieve this is to provide curvature on the surfaces 13a and/or 13b of the laser gain medium 13. For example, use of surfaces 13a and/or 13b with concave curvature compensates for positive thermal lensing, and use of surfaces 13a and/or 13b with convex curvature compensates for negative thermal lensing. The choice of curvature is based on the particular laser gain material used and thermal load within the gain material. Preferably, a light beam passing through the curved surfaces 13a and 13b and through the thermal lens region of the gain medium 13 should have substantially reduced net optical focusing power, or no net optical focusing power. It is optimal, but not essential, to position two corrective surfaces 13a and 13b approximately symmetrically about the thermal lens or gain medium 13, to avoid altering the beam path through the gain medium. This is a design problem that depends upon the laser medium, pump power, and pump focusing chosen.

Another method of compensating for thermal lensing is to place a selected lens 29a or 29b between the gain medium 13 and either the first mirror 18 or the second mirror 25 or both, to slightly defocus the light beam. It is optimal, but not essential, to position two corrective lenses 29a and 29b approximately symmetrically about the thermal lens or gain medium 13, to avoid altering the beam path through the gain medium.

In one particular embodiment tested in our laboratory, the laser gain medium 13 is a 3 mm by 3 mm by 3.5 mm (length) body of 1.45 percent doped Nd:YLF with anti-reflection coatings on the flat polished 3 mm by 3 mm faces. The pump light enters through one 3 mm by 3 mm face, and the beam being amplified enters and exits through the pair of opposing 3 mm by 3 mm faces. One 3 mm by 3.5 mm face of the gain medium 13 is glued to a thermoelectric cooler, and the crystalline c-axis of the laser gain material lies in the plane of FIG. 2. The pump diode is a 2 Watt, 200 µm laser diode (Spectra Diode Labs model 2370-C), and 1.6 Watts of pump light is collected and incident on the Nd:YLF gain medium 13. The diode light is collimated by a 200 µm diameter fused silica rod lens before re-imaging by lenses 16 and 17, each with diameter and focal length about 50 mm and 120 mm, respectively. The mirrors 18 and 25 are paraboloidal, have diameter and focal length of about 50 mm and 100 mm, respectively, and are spaced apart along the resonator axis 50 by twice a mirror's focal length, or approximately 200 mm. The pump diode light and the laser light are also polarized in the plane of FIG. 2. The thickness of the Brewster angle plate 40 is about 5 mm. The light beam diameter in the collimated region is about 1 mm, and the beam diameter at the Nd:YLF gain medium 13 is about 0.2 mm. The laser diode is focused to a 0.2 mm diameter spot.

Figure 1:
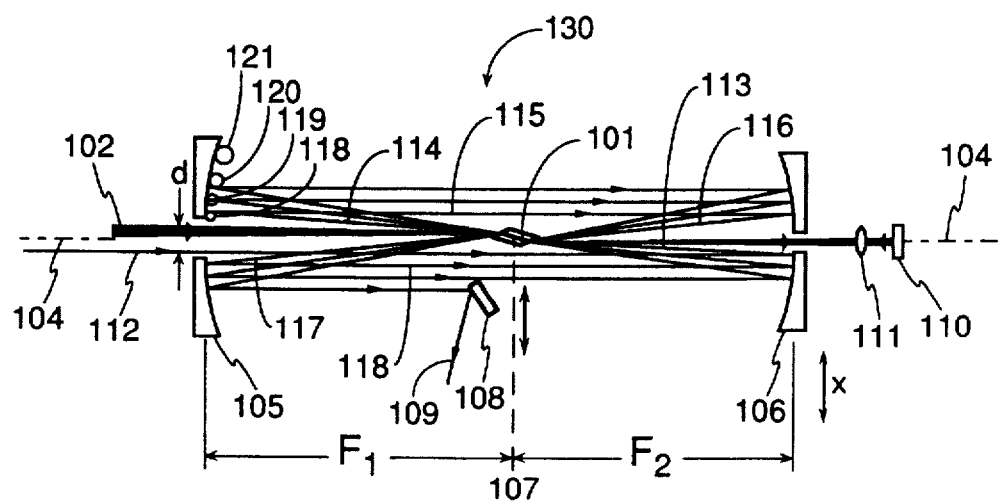
FIG. 1 is a diagram of an amplifier in the prior art by Georges et al, including a frequency doubled Nd:YAG laser end-pumped Ti:sapphire gain medium within a multi-pass cell. The opposing mirrors forming the multi-pass cell are of differing focal lengths, causing the beam to take a different path on each pass of the gain medium.

The embodiment illustrated herein differ from the design of Georges et al shown in FIG. 1: Our invention provides a beam waist size that is approximately constant for all passes of the light beam through the gain medium 13. This is also true for a second embodiment, illustrated in FIG. 6 and discussed below. The progression of beam transverse displacement inward or outward from the central or resonator axis 50 in FIG. 2 is linear, not geometric as in the Georges et al design shown in FIG. 1.

In the geometries of Khoroshilov et al and of Georges et al discussed above: (1) the amplified beam path is translated geometrically through the multi-pass cell by making the parabolas of different focal lengths (not "symmetric confocal") so that the beam waist increases (or decreases) geometrically on each pass, which can be undesirable; (2) the Georges et al and Khoroshilov et al pumps are near diffraction limited; and (3) the Georges et al apparatus pumps through a small hole in one of the paraboloidal mirrors in the amplifier so that the pump light beam must be able to fit through the mirror's aperture. In the geometry of the subject invention, (1) the amplified beam path is translated linearly, with the beam diameter being approximately constant throughout amplification, (2) laser diode pumping is employed, and (3) the pump beam uses a larger numerical aperture than the hole in the Georges design and thus can accept inferior and less diffraction-limited pump beams.

After 12 passes of a light beam through the Nd:YLF gain medium 13 we measure 38 dB of small signal gain of the light beam, comparing amplified power out to unamplified power output from the cell. Typical laser amplifier results from this configuration are shown in Table 1. Those data were taken with 12 passes of the amplifier, with a temperature controlled Nd:YLF gain medium, and with 1.6 Watts of pump energy focused on the amplifier medium. The time durations Δt are input pulse widths, full width at half-maximum intensity.

TABLE 1

| Typical amplifier results with continuous (cw) or pulsed input | | |
|---|---|---|
| | Unamplified output | Amplified output |
| cw input (small signal) | 5 µwatts | 30 mwatts |
| cw input | 1 mwatt | 240 mwatts |
| cw input (near saturation) | 35 mwatts | 620 mwatts |
| 1 kHz pulsed input, Δt | 6 µjoule, 1.0 nsec | 125 µjoule, 1.0 nsec |
| 10 kHz pulsed input, Δt | 2.5 µjoule, 2.1 nsec | 45 µjoule, 2.1 nsec |

Variations on the embodiment shown in FIGS. 2 and 3 may be helpful in particular situations. In other tests we have used 2 to 16 passes of the gain medium 13, and the concept shown here is obviously extendible to fewer or greater numbers of passes. With appropriate optics chosen, either odd or even numbers of light beam passes through the amplifier cell 14 are possible. Once the light beam efficiently extracts the energy or power available from the gain medium 13, additional passes merely present a loss due to addition of surfaces and added alignment complexity. In another variation on the embodiment shown in FIGS. 2 and 3, the path of the beam through the amplifier could be reversed, with the input and output interchanged. In this reversed embodiment, the input light beam enters the amplifier cell 14 through the hole or aperture 26 positioned adjacent to or on the resonator axis 50 and passes out of the cell at the edge of one of the mirrors 18 or 25.

Figure 4:
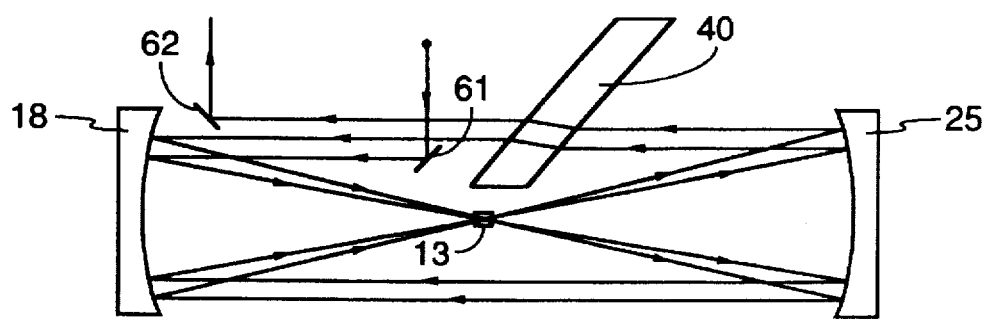
FIG. 4 illustrates another embodiment, analogous to that of FIG. 2, in which a light beam is inserted into, or removed from, an amplifier cell using a small mirror.

In an alternative embodiment, shown in FIG. 4, the beams can be coupled into and/or out of the amplifier cell 14 by small mirrors 61 and/or 62 positioned to receive a light beam and reflect this beam into the cell (mirror 61 ) or out of the cell (mirror 62). This embodiment does not require provision of a hole or aperture in either of the end mirrors 18 or 25.

The laser gain medium 13 can optionally be side-pumped from one or both sides of the cell. The gain medium 13 can also be longitudinally pumped, through the first mirror 18 or through the aperture 26 in the second mirror 25.

The input light beam can be tailored using a variety of optical means (lenses and/or mirrors) to position a beam waist within the gain medium 13 with the desired waist radius. The optical paths shown in FIG. 2 can be folded using mirrors to make the amplifier or the pump beam optics fit into desired arrangements. The laser gain medium 13 can be attached to a heat spreader 52, as shown in FIG. 3, at one or more surfaces of the gain medium, to draw off accumulated thermal energy from the gain medium.

The plate 40 can be oriented at an angle different from the Brewster angle, to provide fine adjustments for the transverse displacement of the light beam. For a large deviation from the Brewster angle, antireflection coatings can be applied to light-receiving surfaces 40a and 40b of the plate 40 to reduce surface losses.

The light beam paths shown in FIGS. 2, 3 and 4 are displaced or translated in one spatial direction (x in FIG. 2) away from (or toward) the central axis 50 on progressive cycles through the amplifier cell, as shown explicitly in FIG. 2. In another spatial direction (y in FIG. 3), which is independent of but need not be orthogonal to the x-direction in FIG. 3, a beam aperture 51 is inserted to suppress parasitic oscillations in the light beam. If the gain of the amplifier is not great enough, the light beam leaving the cell 14 can be re-imaged back into the cell in the y-direction shown in FIG. 3, and a second Brewster angle plate (not shown) can be added so that the re-introduced light beam is transversely displaced within the cell in both the x- and y-directions. This second plate (optional) would suppress parasitic oscillations, and the aperture 51 introduced above for this purpose would not be needed.

However, with too much gain present, amplified spontaneous emission (ASE) begins to waste power. With 38 dB of small signal gain present, ASE consumes 5 to 10 milliwatts of the unsaturated output, but far less of the saturated output. This 5 to 10 mwatts is about 1 percent of the power available to the amplified beam. With substantially larger small-signal gain, the ASE would absorb more power from the amplifier and would contribute to a large optical noise background from the amplifier. The second optional plate would be suitable only if the single pass gain of the light beam is lowered by use of a larger beam or of a lower gain laser medium. The ASE itself may be useful for some applications as a spatially near diffraction-limited source of broad-band light. The ASE can be intentionally increased greatly by placing a mirror on one end of the amplifier, if the object is to produce an output light beam consisting of ASE light.

The embodiments shown in FIGS. 2, 3 and 4 are suitable for (longitudinal) end-pumping of the gain medium by a variety of pumping sources and optics. Optionally, the gain medium could also be side-pumped, with some loss in efficiency. If more gain is desired, the light beam that emerges from the amplifier cell 14 can be retro-reflected and passed through the cell along the same path but in the reverse direction. A Faraday rotation isolator or other suitable light beam separator can be positioned at the light beam input end to separate the input light beam from the retro-reflected output light beam. Use of a retro-reflected light beam that propagates in the reverse direction may be preferable to cycling of the light beam through the cell N times rather than N times. The area of the optically finished mirrors 18 and 25 in FIG. 1 need not be increased to allow for additional transverse light beam displacement that accompanies the extra cycles for a retro-propagated light beam.

As an alternative approach, two or more amplifier cells could be placed in series to obtain increased amplification, if more gain or power is desired. The amplifier cells can be progressively larger in power and in physical size. If the amplifiers are not saturated and are storing energy, as they might do awaiting input from an infrequently pulsed oscillator, ASE or parasitic oscillations may be a problem with the greater gain of a series of amplifier cells. A series of amplifiers operating in saturation can be used with cw pump energy input.

The amplifier cell 14 shown in FIGS. 2, 3 and 4 can be pumped with higher power diodes. We have pumped Nd:YAG, mid Nd:YVO$_4$ with up to 12 Watts of pump power, although this is not a limit to the possible pump power. Many other laser materials may be used including solids such as, but not limited to: Nd:YLF, Nd:YAG, Nd:YVO$_4$, Nd:YOS, Cr:LiSAF, Cr:LiCAF, Er:glass, Tm:YLF, Tm:YAG, Tm:YVO$_4$, Ho:Tm:YLF, Ho:Tm:YAG, Ho:Tm:YVO$_4$, Yb:YLF, Yb:YAG, Yb:YVO$_4$, Nd:glass, Ti:sapphire, ruby, alexandrite, other Nd doped materials or materials in YAG, YLF, YOS, or YVO$_4$ hosts. Liquid and gaseous laser media or certain semiconductors may also be used as the gain medium 13, and optical or electrical pumping may be used. Each of these materials can support light beam amplification for one or more wavelengths of light.

Diode pump sources emit from apertures of different sizes. Using larger (or smaller) area sources, the pumped volume in the laser gain material of the amplifier cell can increase (or decrease), and for optimal amplifier output power the diameter of the beam being amplified in the laser material is also optimally increased (or decreased). This is done by focusing the input beam more (or less) tightly at the midplane of the amplifier so that the first reflection from the paraboloidal mirror makes the beam focus less (or more) tightly in the laser material. Scaling the whole system in size is more complex and affects the cost, the pumping method, the laser gain medium size and mounting, and the number of passes the beam can make in the amplifier without beam clipping. Also the input and output optics may change. Changing the input beam parameters, by contrast, is relatively easy and can accommodate moderate (for example, two-fold) changes in the pumped diameter.

To accommodate more extensive changes the overall size of the cell can be changed. A larger cell with proportionally longer focal length mirrors will generally work better for larger pump diameters. The exact choice of amplifier mirrors and input beam parameters needed to suit a particular pump beam diameter must be optimized based on the desired gain, power, pump source, and gain medium. For example, if the amplifier cell embodiment of FIG. 2 is scaled up in size geometrically so that the focal lengths of the mirrors are increased, but the input light beam diameter $\omega_1$ is scaled up in size as the square root of the geometric scale factor, the beam diameter $\omega_2$ within the amplifier also scales as the square root of the geometric scale factor and can accommodate a larger pump beam radius, which can provide higher output power.

The amplifier cell shown in FIG. 2 could amplify cw, modulated, Q-switched, or ultrashort pulses. Use of a large beam diameter in the Brewster angle plate 40 is advantageous in preventing nonlinear effects when amplifying high peak power pulses. The cell is useful for amplifying single transverse mode beams. The cell can be pumped by an oversized mode and can then support a wider field of view for the input beam, although the output mode quality and the amplifier cell efficiency may degrade.

Figure 5:
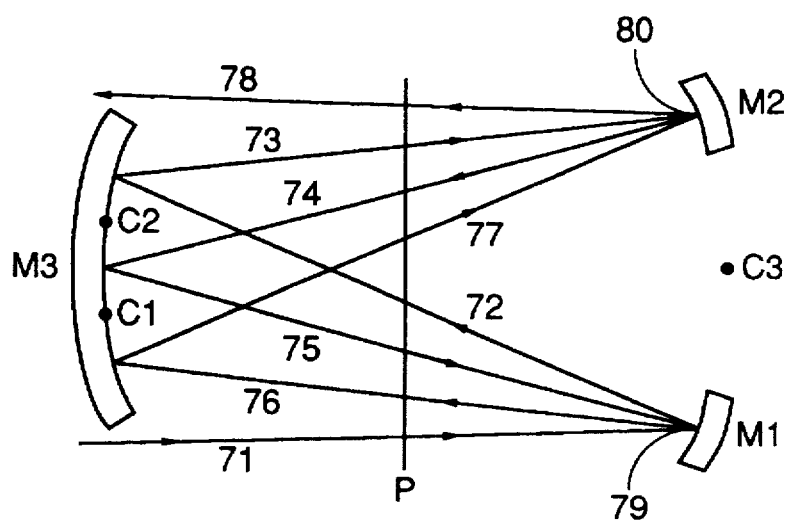
FIG. 5 illustrates a multi-pass cell in the prior art known as a "White cell."

FIG. 5 illustrates a multi-pass optical device known as a "White Cell", introduced by J. U. White in Jour. Opt. Soc. America, vol. 32 (1942) pp. 285–288, incorporated herein by reference. The White Cell includes three spherical mirrors, M1, M2, and M3 with respective centers of curvature C1, C2, and C3 as shown. Two mirrors, M1 and M2, face a third mirror M3. A light beam 71 enters the White Cell and is reflected along a path 72, 73, 74, 75, 76, 77, 78 that repeatedly passes through the Cell and then exits therefrom. Each reflection from the first mirror M1 occurs at the same spot 79 on that mirror, and each reflection from the second mirror M2 also occurs at the same spot 80 on that mirror.

The three mirrors M1, M2 and M3 preferably have equal radii of curvature R and equal focal lengths $f_O$, within practical manufacturing tolerances. The centers of curvatures of the two mirrors M1 and M2 are located in the surface of the opposing mirror M3, and the center of curvature of the mirror M3 is located in a spherical surface extending between the mirrors M1 and M2, as shown. The foci of the three mirrors M1, M2 and M3 lie in a common midplane P between the opposing mirrors. The injected light beam 71 needs to be tailored to initially have a waist at the plane P and will then continue to have a waist at the plane P after each mirror reflection. The beam waist size progression follows the same analysis as in the amplifier cell of FIG. 2. The number of passes that the beam makes before leaving the White Cell is determined by the separation of the centers of curvature C1 and C2, and this separation is adjustable. However, with some spacings of the centers of curvature, the beam entering the White Cell emerges retro-reflected along the path of the input light beam after passing through the White Cell (not shown in FIG. 5).

Figure 6:
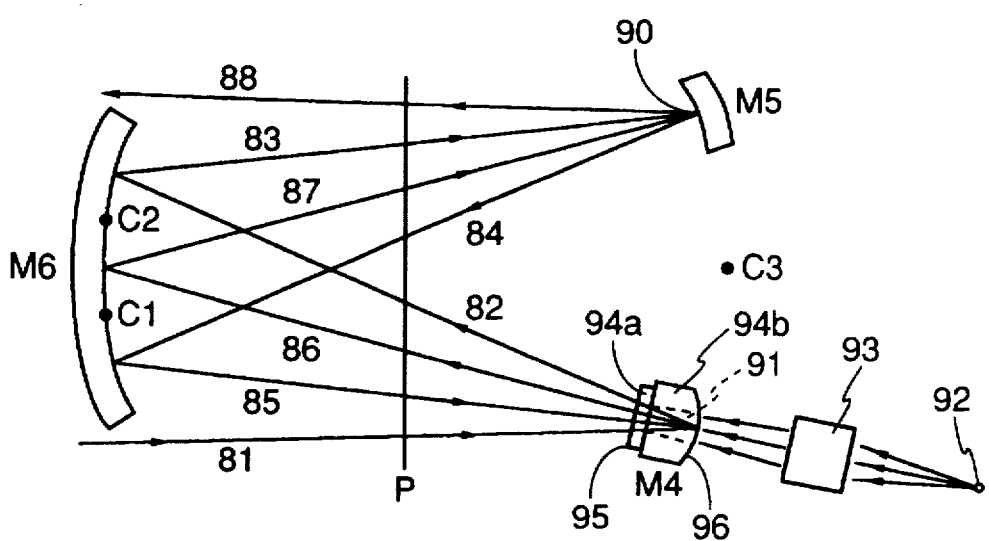
FIG. 6 illustrates another embodiment, using modifications of the White cell.

FIG. 6 illustrates an embodiment of the invention, using a White Cell as an optical or laser amplifier cell. This is a more complex three-mirror alternative to the preferred embodiment of FIG. 2. The White Cell amplifier has a gain medium located contiguous to a mirror, and this amplifier is more sensitive if thermally induced misalignment or wedging occurs at or in the gain medium. The light beam follows a multi-pass path through the White Cell along the consecutive path segments 81, 82, 83, 84, 85, 86 and 87 and exits from the White Cell along a path segment 88. However, a combined laser gain medium/mirror 94a/94b, shown in greater detail in FIG. 6A, replaces the mirror M1 of FIG. 5, and an active volume 91 where the beams pass through the gain medium 94a is pumped by a light source 92 that is imaged by suitable optics 93, as shown in FIG. 6. The pump light source may be any appropriate pump, for example, one or more laser diodes. The tailored beam from one or more laser diodes may be sent using lenses, mirrors, prisms, fibers or other standard optical components to the active volume 91.

First and second surfaces 95 and 96 of the gain medium 94a are coated to pass light with the pump wavelength $\lambda p$ and to reflect light having the wavelength $\lambda L$. Mirrors M2 and M3 are coated to be highly reflective for the light beam being amplified. The gain medium 94 is shown with an outwardly facing convex surface; however there are many options to make the light beam at the gain medium 94a experience focusing equivalent to the mirror M1 of FIG. 5. For example, instead of flat surfaces 95 and 96, these surfaces could be convex or concave. Alternatively, the surfaces 95 and 96 can be flat and a lens 97 can be placed in proximity to the surfaces 95 and 96. Alternatively, the surface 96 can be antireflection coated, and a concave mirror can be used in proximity to surface 96. The waste heat portion of the pump power deposited in the gain medium 94a can cause development of a thermal lens within the gain medium. One or more of the mechanisms discussed above for controlling focusing power on the gain medium 94a can be used to compensate for thermal lensing.

For the multi-pass laser amplifier cell embodiments shown in FIGS. 2, 4 and 6, a beam is amplified by multiply passing through a gain medium. Beam waists are located in the plane P approximately midway between mirrors defining the cell. The radii of these beam waists can be understood using the analysis of H. Kogelnik and T. Li, "Laser beams and resonators", Proc. I.E.E.E., vol. 54 (1966) pp. 1312–1329. The concept of matching the gain and beam profiles is discussed by K. Kubodera & J. Noda, ibid., and by D. L. Sipes, ibid. The method for calculating the cavity mode involves Gaussian beam calculations, and is described by Kogelnik and Li and is in many standard optics and laser texts, including A. E. Siegman, *Lasers*, ibid. The embodiments shown in FIGS. 2 and 4 are multi-pass amplifier designs that are confocal. The foci of opposing mirrors may (but need not) have identical focal lengths that lie in a common plane (P) located approximately midway between the mirrors. The mirrors preferably have radii of curvatures, R and focal lengths $f_O=R/2$. The multi-pass amplifier design regarded as a resonator has a Rayleigh range, $z_R$, equal to $f_O$. The beam waist sizes, $\omega_1$ (for light travelling on a path parallel to an axis between the reflective surfaces) and $\omega_2$ (for light travelling on a diagonal path), for consecutive cycles through the amplifier cell can differ. This difference can be tolerated because the beam only passes through the gain medium after one-to-one re-imaging by the cell, and the gain medium acts as an aperture in the cell The beam waist sizes on alternating passes are related to the focal length $f_O$ by a relation governing imaging of beam waists, $$f_O = \pi \omega_1 \omega_2 / \lambda. \tag{4}$$

Consequently, if the input beam is tailored to have a beam waist radius of $\omega_1$ at the plane P then the beam will be refocused to a waist located at the gain medium in plane P, and the beam radius there will be $\omega_2$. On alternate passes through the plane P, the waist radius will alternate between $\omega_1$ and $\omega_2$ as long as the amplification in the gain medium is linear across the beam profile and does not effectively aperture or expand by preferentially apodizing or amplifying the wings of the beam profile. Ideally, the beam radius in the gain medium is self-replicating in the amplifier, which means that the gain profile and the beam profile should overlap, as needed with all end-pumped lasers. Because the light beam passes through the gain medium at slightly differing angles on each pass, the beam overlap cannot be perfect on all passes but will manifest acceptable overlap on the average.

Similarly, the amplifier gain generally changes with time. For example, as pulses pass through the gain medium over a time scale of nanoseconds the pulses are amplified as the energy is extracted. Also the overlap can not be perfect on all passes, but again it can match on the average for many passes of the beam. If the input beam radius $\omega_1$ is too large or small then the radius $\omega_2$ in the gain medium will be too small or large.

In the cell of Georges et al shown in FIG. 1 the focal lengths of the two opposing cell mirrors differ, and this changes the analysis and behavior of the cell. In FIGS. 2, 3 and 4, the optical thicknesses of the gain medium 13 and of the Brewster angle plate 40 used in these embodiments are not the same as an equivalent thickness of air, and this will also slightly perturb the mode size analysis and the optimal spacing of the amplifier mirrors. However, the thickness of the gain medium and of the Brewster angle plate are small compared with the dimensions of the optical paths in the amplifier cell, and in practice the amplifier is empirically aligned, with the spacing of the mirrors 18 and 25 in FIG. 2 being adjusted to account for these small effects.

Figure 7A:
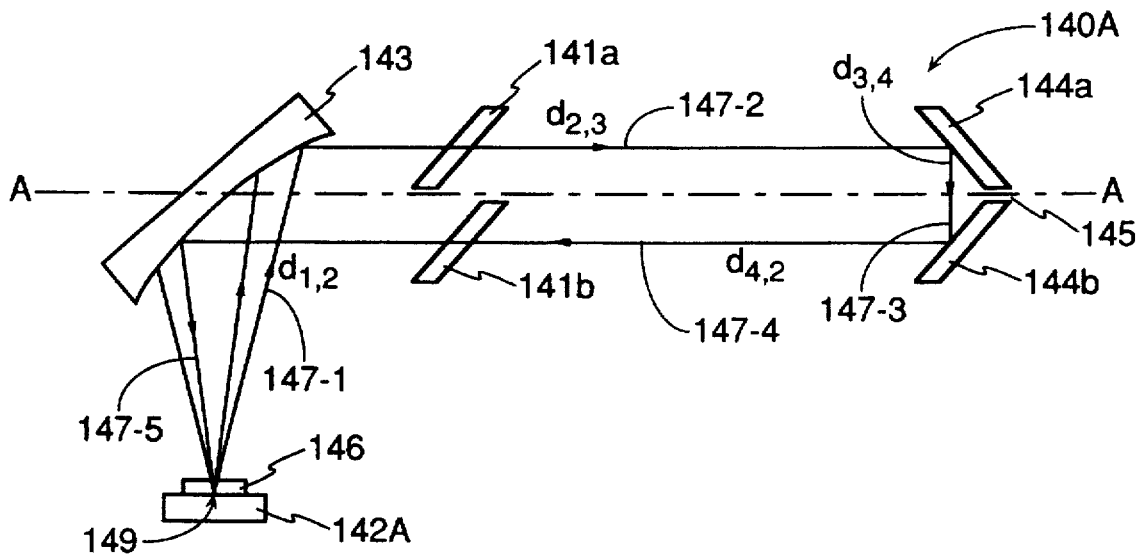
FIGS. 7A, 7B, 8A, 8B, 8C, 8D, 9A, 9B, 10, 11, 12A, 12B, 13A, 13B and 13C illustrate other embodiments of the invention, using other optical cavity configurations.

Other embodiments of the invention, similar to those shown in FIGS. 2–6 are illustrated schematically in FIGS. 7A–13B. FIG. 7A illustrates an embodiment 140A in which an optical cavity is defined by a planar first mirror 142A, a curvilinearly shaped second mirror 143, and third and fourth mirrors 144a and 144b, spaced apart from and facing each other. This embodiment also includes an optical gain medium 146 that is positioned adjacent to, or contiguous to, a reflecting surface of the first mirror 142A. The third and fourth mirrors 144a and 144b are optionally spaced apart from each other by a small distance to create an aperture 145 therebetween. The aperture 145 serves as a light beam insertion means or as a light beam removal means for the cavity. Alternatively, the third and fourth mirrors 144a and 144b may be joined together (not shown in FIG. 7A) so that no aperture 145 appears. The mirrors 144a and 144b are preferably planar mirrors whose planes are approximately perpendicular to each other. An optical cavity axis AA defines a selected direction for this embodiment. Preferably, the optical distance $d_1$ from the first mirror 142A to the second mirror 143 is equal to the focal length $f_2$ of the second mirror; and the sum $(d_{2,3}+d_{3,4}+d_{4,2})$ of the lengths of the path segments from the second mirror 143 to third mirror 144a to fourth mirror 144b to second mirror 143 equals $2f_2$. The "optical distance" between two objects is the actual distance divided by the refractive index of the material positioned between the two objects.

A light beam, such as 147-1, leaving the first mirror 142A and incident on the second mirror 143, is reflected by the second mirror 143 as a light beam 147-2 toward the third mirror 144a in a direction approximately parallel to the axis AA., then reflected by the third mirror as a light beam 147-3 toward the fourth mirror 144b, then reflected by the fourth mirror 144b as a light beam 147-4 along a direction approximately parallel to the axis AA. The light beam 147-4 is reflected by the second mirror 143 as a light beam 147-5 toward a selected focal point 149 that is positioned on the first mirror 142A or within the gain medium 146. This completes one cycle of an optical path, which cycle can be repeated several times. The beam diameter at the focal point 149 changes little, if at all, each time the beam cycles and passes through the gain medium 146.

Optionally, a plate 141 with two plane parallel surfaces that is optically transparent at the wavelength of light to be amplified is positioned in the path segment 147-2 and/or in the path segment 147-4 to receive an incident light beam and translate this beam by a small, controllable amount in a direction approximately perpendicular to the direction of the axis AA, as shown. Using this translation means, a path segment 147-i(i=1, 2, 3, 4, 5) for one cycle will be displaced from that path segment 147-i for any other cycle so that each cycle includes a different set of path segments from the path segments of any other cycle. The path segment translation plate 141 can be deleted, and beam path translation can be accomplished by any of five other approaches: (1) rotate the mirror 142A by a small angle in the plane of the paper in FIG. 7A; (2) rotate the mirror 143 by a small angle in the plane of the paper in FIG. 7A; (3) rotate the mirrors 144a and 144b together by a small angle in the plane of the paper in FIG. 7A; (4) translate one or both of the mirrors 144a and 144b in a direction transverse to the axis AA; and (5) translate the mirror 142A a small amount in a direction approximately perpendicular to the axis AA.

Figure 7B:
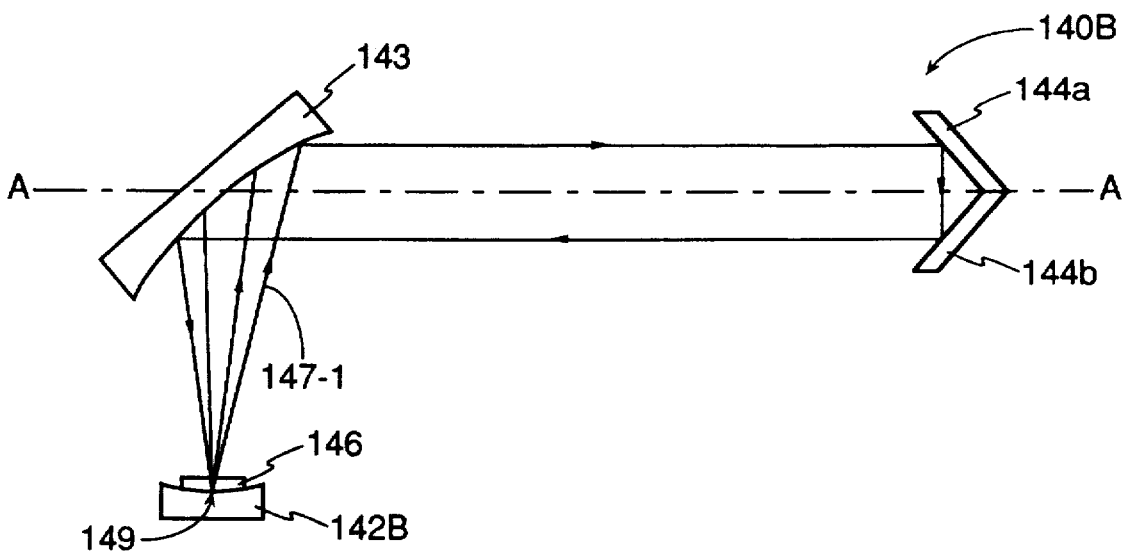

An embodiment 140B shown in FIG. 7B is similar in most respects to the FIG. 7A embodiment, except that: (1) the aperture 145 is absent; (2) the planar first mirror 142A is replaced by a curvilinear mirror 142B that receives and reflects a light beam at approximately perpendicular incidence, with the gain medium 86 being contiguous to the reflective surface of the first mirror 142B. The curvilinear mirror 142B may be used to compensate for development of a thermal lens in the gain medium 146, or for any other purpose.

Figure 8A:
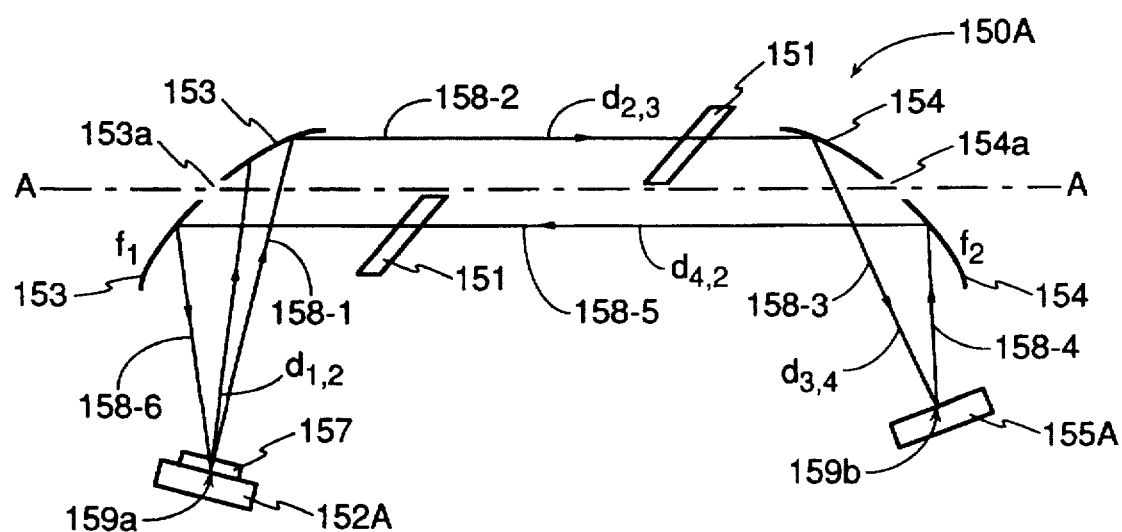

FIG. 8A illustrates an embodiment 150A that includes an optical cavity defined by a first mirror 152A, curvilinearly shaped second and third mirrors 153 and 154, and a fourth mirror 155A, spaced apart from and facing each other. In FIG. 8A, the first and fourth mirrors are planar. Optionally, the second mirror 153 has an aperture 153a therein, or the third mirror 154 has an aperture 154a therein, to serve as a light beam insertion means or as a light beam removal means. Alternatively, one or both of the apertures 153a and 154a may be absent. An optical gain medium 157 is positioned adjacent to, or contiguous to, the first mirror 152A. Preferably, the optical distance $d_{1,2}$ from the first mirror 152A to the second mirror 153 is equal to the focal length $f_2$ associated with the mirror 153; the optical distance $d_{3,4}$ from the third mirror 154 to the fourth mirror 155A is preferably equal to the focal length $f_3$ associated with the third mirror 154; and half the sum $(d_{2,3}+d_{4,2})$ of the lengths of the path segments from the second minor 153 to the third mirror 154 and from the fourth mirror 155A to the second mirror 153 is equal to the sum $f_2+f_3$ of the focal lengths of the second and third mirrors A light beam, such as 158-1, is inserted into the cavity and propagates away from the first mirror 152A and toward the second mirror 153. This light beam is reflected by the second mirror 153 toward the third mirror 154 as a light beam 158-2, in a direction approximately parallel to a selected cavity axis AA. The beam 158-2 is reflected from the third mirror 154 toward the fourth mirror 155A as a beam 158-3, then is reflected at a selected focal point 159b from the fourth mirror 155A toward the third mirror 154 as a beam 158-4 toward the third mirror 154. The beam 158-4 is reflected from the third mirror 154 as a beam 158-5 in a direction approximately parallel to the direction of the axis AA. The light beam 158-5 is reflected from the second mirror 153 toward the first mirror 152A as a light beam 158-6, then is reflected by the first mirror 152A at a selected focal point 159a toward the second mirror 153 to complete a cycle of an optical path. The beam diameter at the focal point 159a changes little, if at all, each time the beam cycles and passes through the gain medium 152A.

Optionally, an optically transparent plate 151 with two plane parallel surfaces is positioned in the path segment 158-2 and/or in the path segment 158-5 to receive an incident light beam and translate this beam by a small, controllable amount in a direction approximately perpendicular to the direction of the axis AA, as shown. Using this translation means, a path segment 158-i(i=1, 2, 3, 4, 5, 6) for one cycle will be displaced from that path segment 158-i for any other cycle so that each cycle includes a different set of path segments from the path segments of any other cycle. The path segment translation plate 151 can be deleted, and beam path translation can be accomplished by any of four other approaches: (1) rotate the mirror 152A by a small angle in the plane of the paper in FIG. 8A; (2) rotate the mirror 153 by a small angle in the plane of the paper in FIG. 8A; (3) rotate the mirror 154 by a small angle in the plane of the paper in FIG. 8A; (4) rotate the mirror 155A by a small angle in the plane of the paper in FIG. 8A; (5) translate either of the mirrors 152A or 155A a small distance approximately perpendicular to the axis AA; and (6) translate either of the mirrors 153 or 154 a small distance approximately parallel to the axis AA.

Figure 8B:
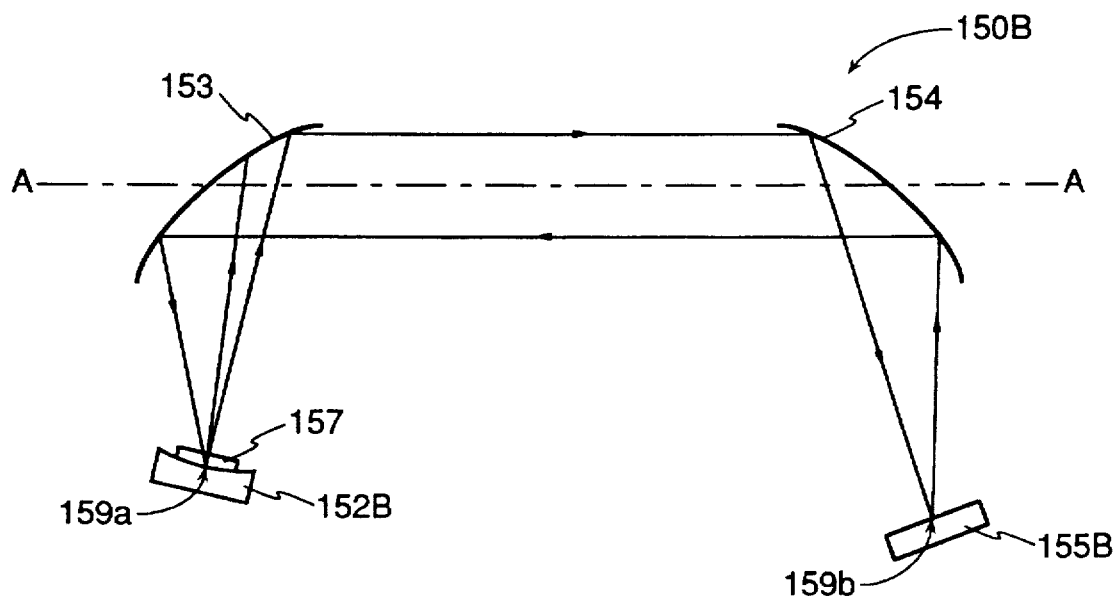

The embodiment 150B shown in FIG. 8B is similar in most respects to the FIG. 8A embodiment, except that: (1) the apertures 153a and 154a are absent; (2) the first mirror 152A is curvilinearly shaped and the gain medium 157 is contiguous to the first mirror 152A.

Figure 8C:
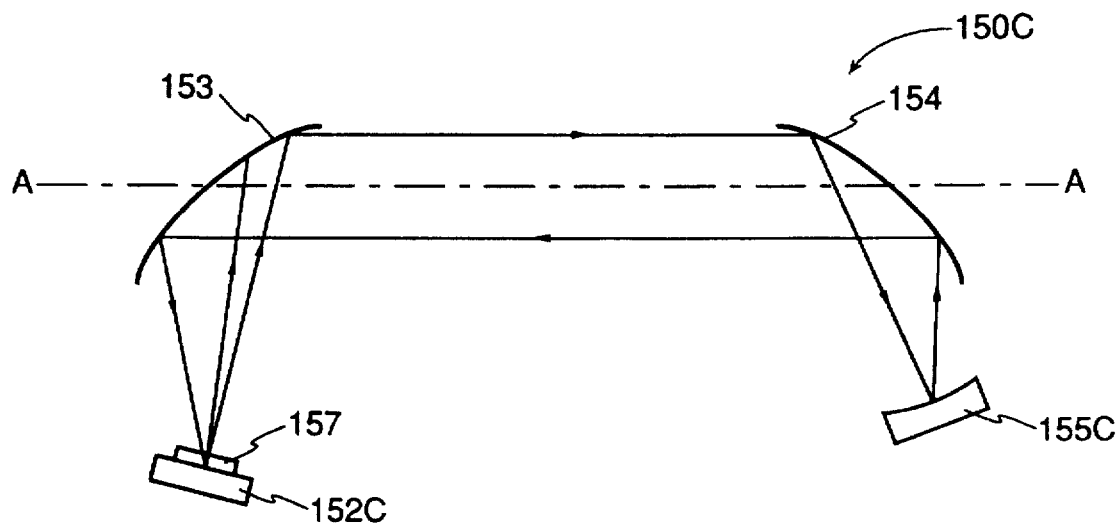

The embodiment 150C shown in FIG. 8C is similar in most respects to the FIG. 8A embodiment, except that: (1)

the apertures 153*a* and 154*a* are absent; and (2) the fourth mirror 155A is curvilinearly shaped and the gain medium 157 is contiguous to the fourth mirror 155A. In another embodiment, not shown explicitly here but combining the features of FIGS. 8A, 8B and 8C, the first mirror 152A and fourth mirror 155A are both curvilinearly shaped.

Figure 8D:
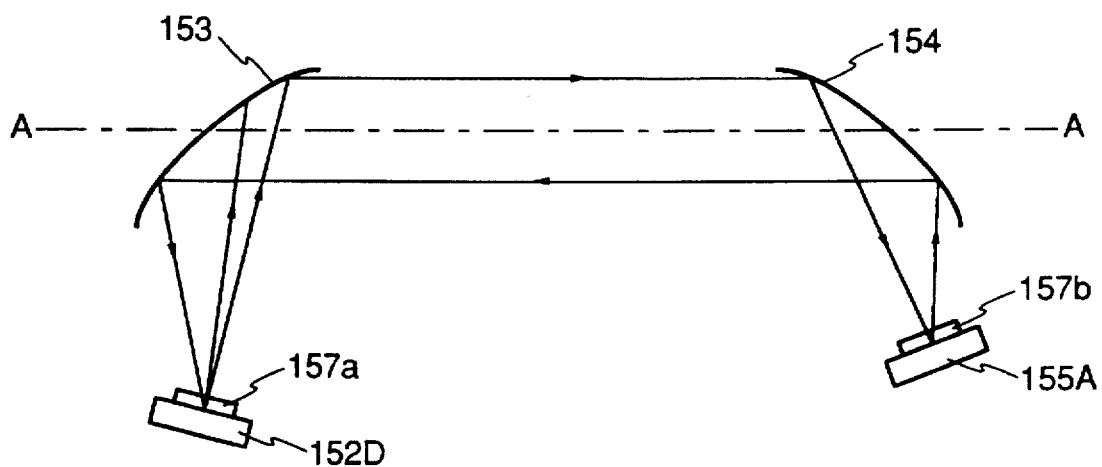

The embodiment 150D shown in FIG. 8D is similar in most respects to the FIG. 8A embodiment, except that a first gain medium 157*a* is positioned contiguous to a first mirror 152D and a second gain medium 157*b* is positioned contiguous to a fourth mirror 155D, as shown. The different features shown in FIGS. 8A, 8B, 8C and 8D may be permuted to produce many other variations on the basic version of the embodiment shown in FIG. 8A.

Figure 9A:
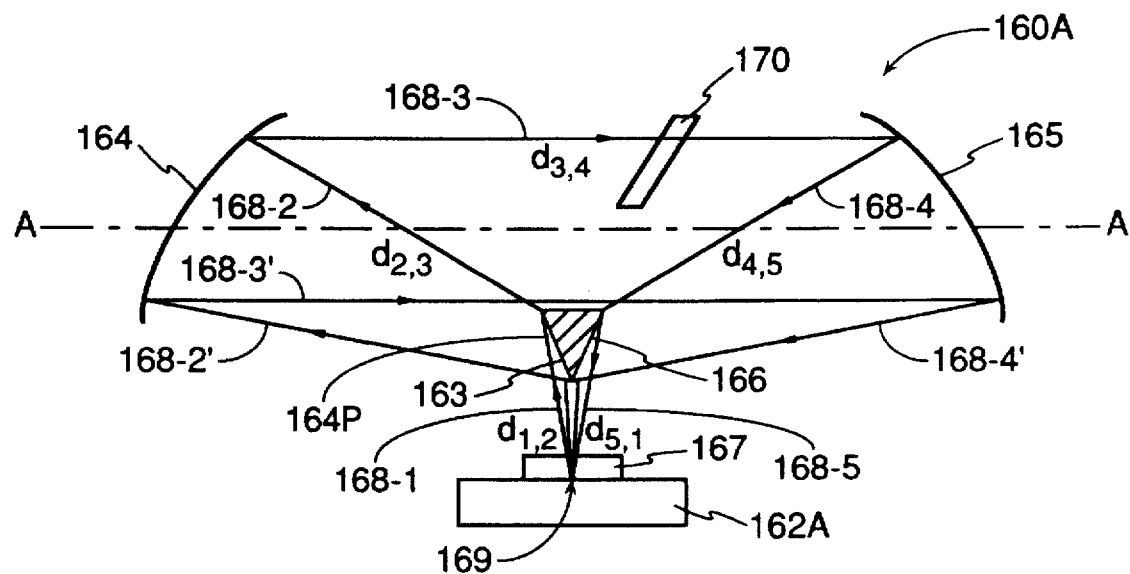

FIG. 9A illustrates an embodiment 160A that includes an optical cavity defined by a planar first mirror 162A, a second mirror 163, curvilinearly shaped third and fourth mirrors 164 and 165, spaced apart and facing each other, and a fifth mirror 166. In FIG. 9A, the first, second and fifth mirrors 162A, 163 and 166 are planar. Preferably, the third mirror 164 and the fourth mirror 165 are paraboloidally shaped or spherically shaped. An optical gain medium 167 is positioned adjacent to, or contiguous to, the first mirror 162A. A light beam 168-1 moves away from the first mirror 162A toward the second mirror 163. The beam 168-1 is received by the second mirror 163 and reflected as a beam 168-2 toward the third mirror 164. The beam 168-2 is received by the third mirror 164 and reflected as a light beam 168-3 toward the fourth mirror 165, in a direction approximately parallel to a selected axis AA. The beam 168-3 is received by the fourth mirror 165 and reflected as a light beam 168-4 toward the fifth mirror 166. The beam 168-4 is received by the fifth mirror 166 and reflected as a light beam 168-5 toward a selected focal point 169 on the first mirror 162A, where it is reflected toward the second mirror 163 to complete an optical path within the cavity. A second possible optical path cycle for a light beam within the cavity is also indicated in FIG. 9A. Preferably, the optical distance $d_{1,2}$ from the first mirror 162A to the second mirror 163 plus the optical distance $d_{2,3}$ from the second mirror 163 to the third mirror 164 is equal to the focal length $f_3$ associated with the third mirror 164. Preferably, the optical distance $d_{4,5}$ from the fourth mirror 165 to the fifth mirror 166 plus the optical distance $d_{5,1}$ from the fifth mirror to the first mirror 162A is equal to the focal length $f_4$ associated with the fourth mirror 165. Preferably, the distance $d_{3,4}$ from the third mirror 164 to the fourth mirror 165 is approximately equal to the sum $f_3+f_4$ of the focal lengths of the third and fourth mirrors. The beam diameter changes little, if at all, each time the beam cycles and passes through the gain medium 167.

Optionally, an optically transparent plate 170 with two plane parallel surfaces is positioned in the path segment 168-3 to receive an incident light beam and translate this beam by a small, controllable amount in a direction approximately perpendicular to the direction of the axis AA, as shown. Using this translation means, a path segment 168-i(i=1, 2, 3, 4, 5) for one cycle will be displaced from that path segment 168-i for any other cycle so that each cycle includes a different set of path segments from the path segments of any other cycle. The path segment translation plate 170 can be deleted, and beam path translation can be accomplished by any of five other approaches: (1) rotate the mirror 162A by a small angle in the plane of the paper in FIG. 9A; (2) rotate the mirror 164 and the mirror 165 by small coordinated angles in the plane of the paper in FIG. 9A; (3) rotate the mirror 163 and the mirror 166 by small coordinated angles in the plane of the paper of FIG. 9A; (4) translate the mirror 162A a small distance perpendicular to the axis AA; and (5) translate the mirror 164 or 165 a small distance approximately perpendicular to the axis AA.

Figure 9B:
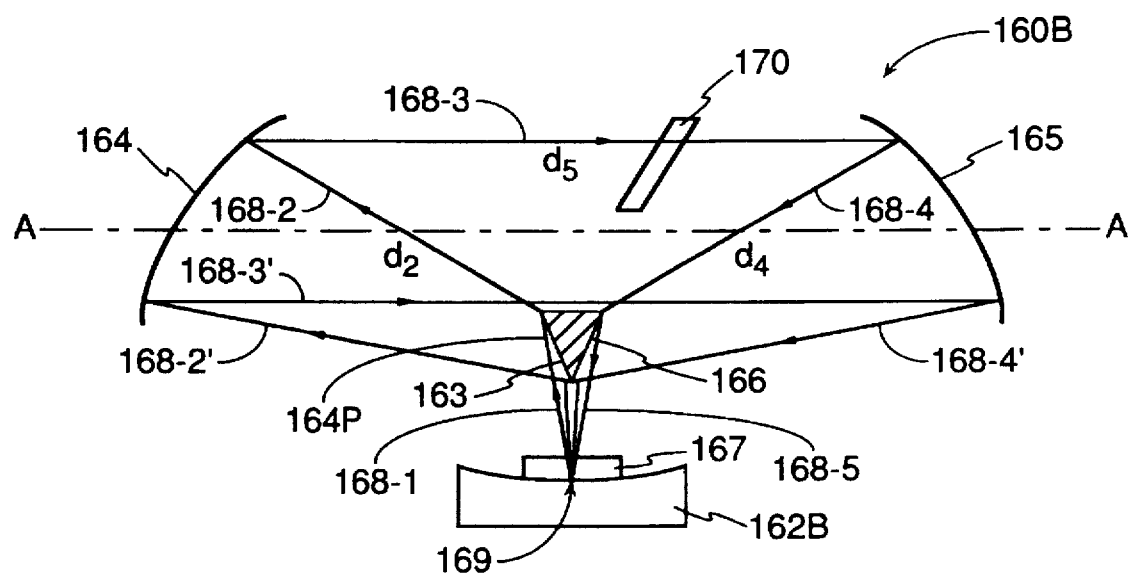

An embodiment 160B shown in FIG. 9B is similar in most respects to the FIG. 9A embodiment, except that the first mirror 162B is curvilinearly shaped and the gain medium 167 is contiguous to the reflective surface of the mirror 162B.

Figure 10:
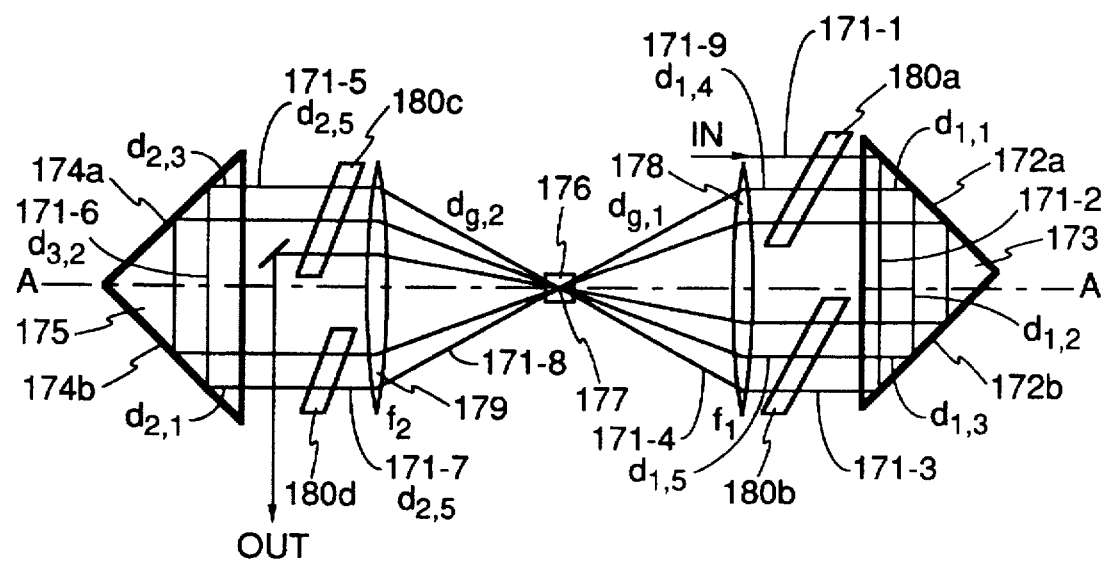

FIG. 10 illustrates an embodiment including an optical cavity having a selected axis AA and defined by planar, perpendicular first and second mirror surfaces 172*a*, 172*b*, which are part of a first prism 173 (made of material with refractive index $n_1$), and planar, perpendicular third and fourth mirror surfaces 174*a* and 174*a*, which are part of a second prism 175 (made of material with refractive index $n_2$). The two mirror surfaces 172*a* and 172*b* face and are spaced apart from the two mirror surfaces 174*a* and 174*b* as shown. An optical gain medium 176, having a selected focal point 177 in the gain medium, is positioned between the mirror pair 172*a*/172*b* and the mirror pair 174*a*/174*b*. A first lens system 178 is positioned between the two mirrors 172*a* and 172*b* and the gain medium 176. A second lens system 179 is positioned between the two mirrors 174*a* and 174*a* and the gain medium 176. The lens systems 178 and 179 each receive a light beam traveling approximately parallel to the axis AA and focus the beam toward the selected focal point 177, and conversely. Preferably, the optical distance $(d_{1,1}+d_{1,2}+d_{1,3})n_1$ of a light beam path within the prism 173 plus the optical distance $d_{1,4}$ from the first lens system 178 to the prism 173 plus the distance $d_{1,5}$ from the prism 173 to the lens system 178 is equal to twice the focal length, $2f_1$, of the lens 178. Preferably, the optical distance $(d_{2,1}+d_{2,2}+d_{2,3})/n_2$ of a light beam path within the prism 175 plus the optical distance $d_{2,4}$ from the second lens system 179 to the prism 175 plus the distance $d_{2,5}$ from the prism 175 to the lens system 179 is equal to twice the focal length, $2f_2$, of the lens 179. Preferably, the distance $d_{g,1}$ from the first lens system 178 to the focal point 177 in the gain medium 176 is equal to $f_1$; and the distance $d_{g,2}$ from the second lens system 179 to the focal point 177 is equal to $f_2$.

A light beam 171-1 initially propagating parallel to the cavity axis AA is received by the first mirror surface 172*a* and reflected toward the second mirror surface 172*b* as a beam 171-2, and is received and reflected by the mirror surface 172*b* as a beam 171-3 that propagates approximately parallel to the axis AA. The beam 171-3 is received by the lens system 178 and directed toward the focal point 177 as a beam 171-4. The beam 171-4 passes through the gain medium 176 and focal point 177, is received by the lens system 179, and is directed toward the mirror surface 174*a*, approximately parallel to the axis AA, as a beam 171-5. The beam 171-5 is received by the third mirror surface 174*a* and reflected as a beam 171-6 toward the fourth mirror surface 174*b*. The beam 171-6 is received and reflected as a beam 171-7 that propagates approximately parallel to the axis AA. The beam 171-7 is received by the lens system 179 and directed toward the focal point 177 as a beam 171-8. The beam 171-8 passes through the gain medium 176, is received by the lens system 178, and is directed toward the first mirror 172*a*, approximately parallel to the axis AA, as a beam 171-9, thus completing a beam path cycle. The beam diameter changes little, if at all, each time the beam cycles and passes through the gain medium 176.

An optically transparent plate 180*a*, 180*b*, 180*c* and/or 180*d* having two planar parallel surfaces is optionally placed in one of the beam path segments 171-1, 171-3, 171-5 or 171-7, respectively, to provide cycle-to-cycle translation or transverse displacement of the light beam path by a small amount in a direction approximately perpendicular to the cavity axis AA, for each beam path cycle. Alternatively, the prism two mirror surfaces 172a and 172b may be translated a small distance approximately perpendicular to the axis AA, or these two mirror surfaces may be rotated, about any center except the apex of the prism 173, by a small angle in the plane of the paper of FIG. 10. Alternatively, the two mirror surfaces 174a and 174b may be translated a small distance approximately perpendicular to the axis AA, or these two mirror surfaces may be rotated, about any center except the apex of the prism 175, by a small angle in the plane of the paper of FIG. 10. Alternatively, the center of the first lens system 178 or the center of the second lens system 179 may be translated a small distance approximately perpendicular to the axis AA.

Figure 11:
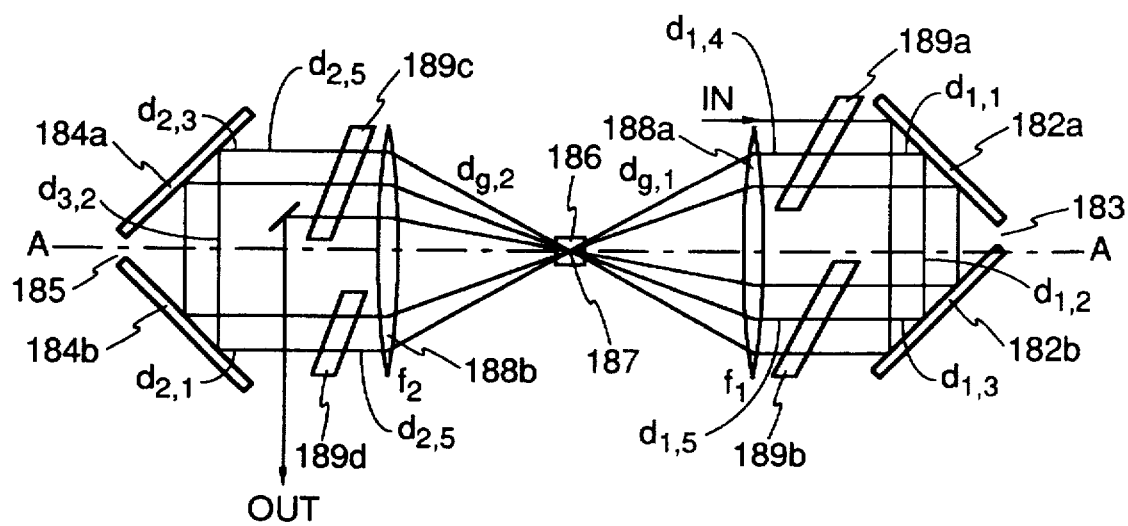

FIG. 11 illustrates an embodiment that is similar in most respects to the FIG. 10 embodiment, with the following changes: (1) the prisms 173 and 175 and corresponding mirror surfaces 172a, 172b, 174a and 174b are removed and replaced by planar first, second, third and fourth mirrors 182a, 182b, 184a and 184b in FIG. 11, with the same planar orientations, and the refractive indices $n_1$ and $n_2$ for the intervening material are formally set equal to 1 in the distance constraint equations; (2) the two mirrors 182a and 182b are optionally spaced apart from each other by a small distance, to provide an aperture 183 for beam insertion into, or beam removal from, the cavity; (3) the two mirrors 184a and 184b are optionally spaced apart from each other by a small distance, to provide an aperture 185 for beam insertion into, or beam removal from, the cavity; (4) the gain medium 176 and associated beam focal point 177 are replaced by a gain medium 186 and associated beam focal point 187; (5) the lenses 178 and 179 are replaced by lenses 188a and 188b; and (6) the beam translation plates 180a, 180b, 180c and/or 180d are replaced by beam translation plates 189a, 189b, 189c and/or 189d, respectively. The alternative approaches for beam translation discussed in connection with FIG. 10 are also available, mutatis mutandis, as alternative means of beam translation in FIG. 11. Preferably, the distance constraints for the configuration shown in FIG. 11 are the same as the distance constraints for the configuration shown in FIG. 10, with the prisms 173 and 175 and reflective surfaces 172a, 172b, 174a and 174abeing replaced by the reflective surfaces or mirrors 182a, 182b, 184a and 184b, with the prism refractive indices $n_1=n_2=1$. In FIG. 11, as in FIG. 10, the beam diameter at the selected focal point 187 changes little, if at all, each time the beam cycles and passes through the gain medium 186.

Optionally, in any of the embodiments, the light beam can be delivered into the optical cavity or removed from the cavity using a small mirror M1 or M2, respectively, as shown in FIG. 11. Similarly positioned small mirrors may be used for beam insertion into or beam removal from the optical cavity shown in FIG. 10. In any of the embodiments disclosed herein, the gain medium may be optically pumped by light delivered through an optical fiber OF, as illustrated in FIG. 11.

Figure 12A:
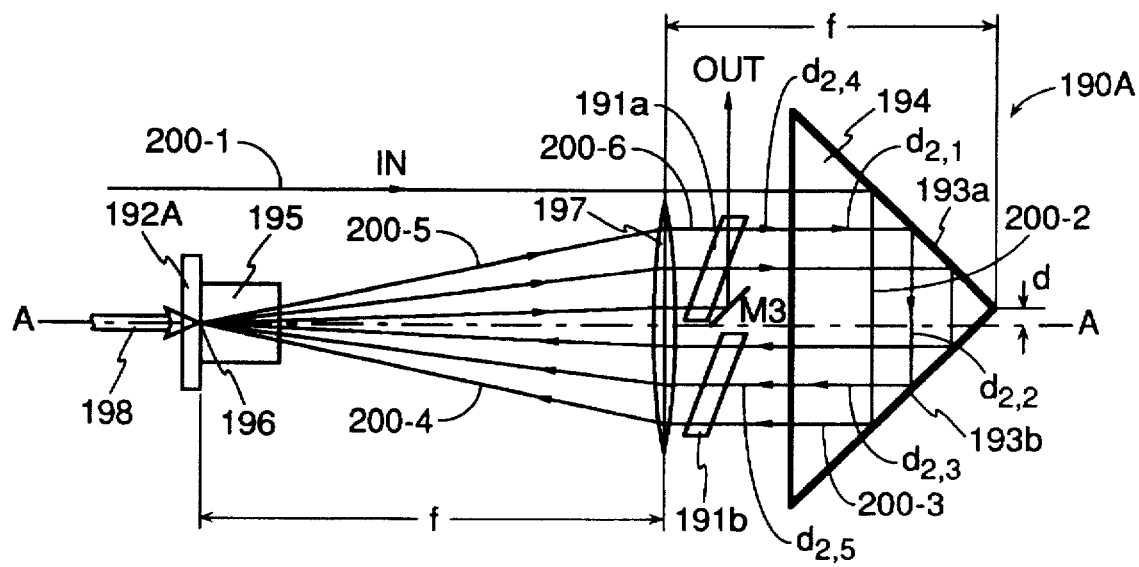

FIG. 12A illustrates an embodiment 190A including an optical cavity having a cavity axis AA and being defined by a planar first mirror 192A and planar second and third mirror surfaces 193a and 193b, which are surfaces of an optically transparent prism 194, where the first mirror 192A is spaced apart from and faces the mirror surfaces 193a and 193b. This embodiment has a selected axis AA. The planes of the two mirrors 193a and 193b are oriented approximately perpendicular to each other. An optical gain medium 195 is positioned contiguous to, the first mirror 192A, and a selected focal point 196 is positioned on the first mirror, or on or within the gain medium 195. A lens system 197 receives a light beam propagating approximately parallel to the axis AA away from one of the mirrors 193a or 193b and directs the light beam toward the selected focal point 196, and conversely. The gain medium 195 is pumped, longitudinally or transversely, by an energy beam 198. A light beam 200-1 propagating approximately parallel to the cavity axis AA is inserted into the cavity and follows the beam path segments 200-2, 200-3, 200-4, 200-5, and 200-6 as shown, thus completing a beam path cycle. Preferably, the distance $d_{1,L}$ from the lens 197 to the first mirror 192A is equal to the focal length $f_L$ of the lens 197. Preferably, the optical distance $(d_{2,1}+d_{2,2}+d_{2,3})/n$ of as light beam path within the prism 194 plus the optical distance $d_{2,4}$ from the prism 194 to the lens 197 plus the optical distance $d_{2,5}$ from the prism 194 to the lens 197 is equal to twice the focal length, $2f_L$, of the lens 197, where n is the refractive index value of the material that makes up the prism 194; and the distance from the lens 197 to the first mirror 192A is equal to the focal length $f_L$. The beam diameter at the selected focal point 196 changes little, if at all, each time the beam cycles and passes through the gain medium 195.

An optional small mirror M3 positioned within the cavity provides another means for beam insertion into, or beam removal from, the cavity. Optionally, an optically transparent plate 191a or 191b, having two planar, parallel light-receiving surfaces, is positioned in one of the beam path segments 200-3 or 200-6, respectively, to provide cycle-to-cycle beam path translation in a direction approximately perpendicular to the cavity axis AA. Alternatively, beam path translation can be provided by any of the following four approaches: (1) rotate the first mirror 192A by a small angle in the plane of the paper in FIG. 12A; (2) translate the center of the lens 197 a small distance off the axis AA; (3) translate the prism 194 a small distance approximately perpendicular to the axis AA; (4) rotate the prism, about any center except the apex of the prism 194, by a small angle in the plane of the paper in FIG. 12A; and (5) translate the first mirror 192A a small distance approximately parallel to the axis AA.

Figure 12B:
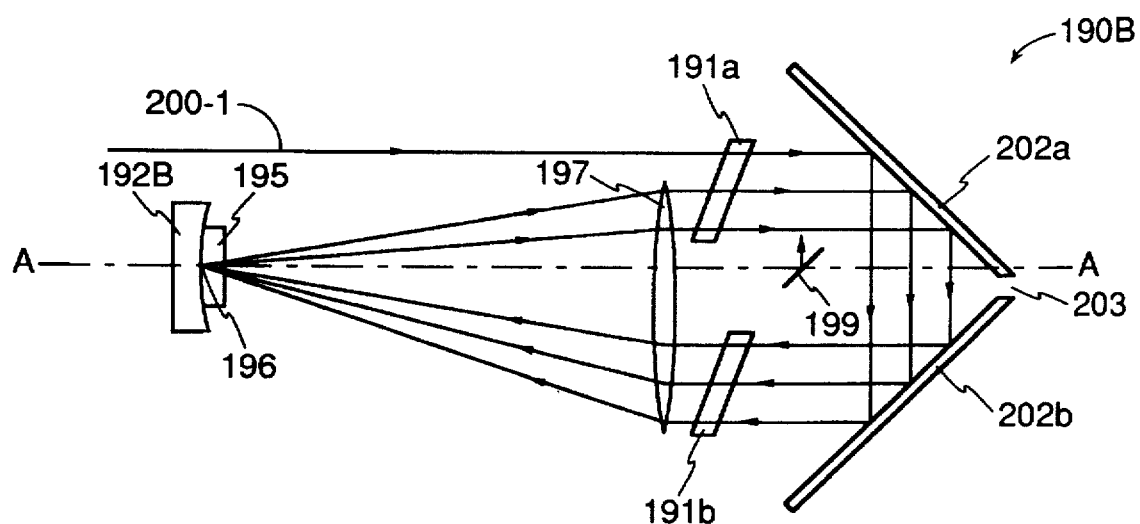

The embodiment 190B shown in FIG. 12B is similar in most respects to the FIG. 12A embodiment, with the following changes: (1) the second and third mirror surfaces 193a and 193b and the prism 194 in FIG. 12A are replaced by two planar mirrors 202a and 202b with the same planar orientation; (2) the two mirrors 202a and 202b are optionally spaced apart a small distance, to provide for beam insertion into, or beam removal from, the cavity; and (3) the planar first mirror 192A in FIG. 12A is optionally replaced by a curvilinearly shaped mirror 192B, and the gain medium 195 is contiguous to the reflective surface of the mirror 192B. The distance constraint relations for the configuration shown in FIG. 12B are the same as the distance constraint relations for FIG. 12A, with the refractive index n being formally set equal to 1 for FIG. 12B. The alternative approaches for beam path translation in FIG. 12A also apply for beam path translation in FIG. 12B.

Figure 13A:
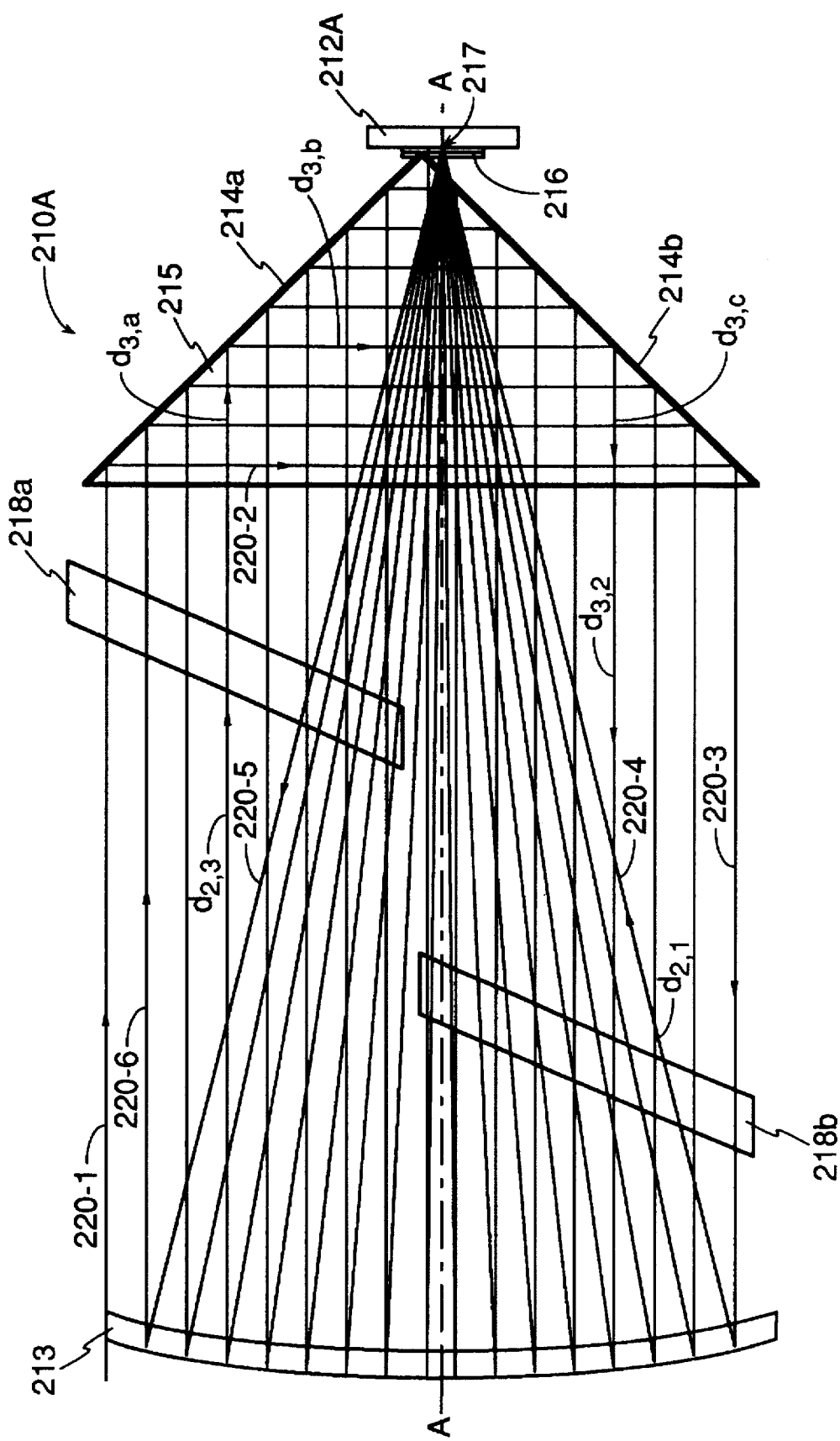

FIG. 13A illustrates an embodiment 210A, including an optical cavity having a cavity axis AA and being defined by a first mirror 212A, a curvilinearly shaped second mirror 213, and third and fourth mirror surfaces 214a and 214b that are part of an optically transparent prism 215 that is positioned out of the plane of the drawing from the first mirror 212A. The second mirror 213 faces and is spaced apart from the first, third and fourth mirrors 212A, 214a and 214b and faces these mirrors. The cavity axis AA passes through the center of the second mirror 213, which is preferably paraboloidally or spherically shaped. An optical gain medium 216 is positioned contiguous to, the first mirror 212A. The second mirror 213 reflects any incident light beam traveling approximately parallel to the axis AA toward a selected focal point 217 on the first mirror 212A or in the gain medium 216, and conversely.

A flight beam 220-1 initially propagates approximately parallel to the cavity axis AA and is received and reflected by the third mirror 214a toward the fourth mirror 214b as a beam 220-2. The beam 220-2 is received and reflected by the fourth mirror 214b toward the second mirror 213 as a beam 220-3, in a direction approximately parallel to the axis AA. The beam 220-3 is received and reflected by the second mirror 213 as a beam 220-4 that passes through the gain medium 216 and the focal point 217 and is reflected by the first mirror 212A as a light beam 220-5. The beam 220-5 moves away from the focal point 217 toward the second mirror 213 and is reflected thereat as a light beam 220-6 that moves toward the third mirror 214a in a direction approximately parallel to the axis AA. This completes a beam optical path cycle. An optional, optically transparent plate 218 with two parallel surfaces is positioned in the beam path 220-3 and/or 220-6 so that each incident, provides cycle-to-cycle beam path translation in a direction approximately transverse to the direction of the axis AA. The plane containing the beam path segments 220-2, 220-3 and 220-6 is displaced rotationally from the plane containing the beam path segments 220-4 and 220-5. This is illustrated in the top view of FIG. 13B.

Preferably, the optical distance $(d_{3,a}+d_{3,b}+d_{3,c})/n$ (n=prism material refractive index) of path segments within the prism 215 plus the optical distance $d_{2,3}$ from the second mirror 213 to the prism 215 plus the optical distance $d_{3,2}$ from the prism 215 to the second mirror 213 is equal to twice the focal length, $2f_2$, of the second mirror 213; and the distance $d_{2,1}$ from the second mirror 213 to the focal point 217 on the first mirror 212A is equal to $f_2$. Here, n is the refractive index of the prism material. The beam diameter changes little, if at all, each time the beam cycles and passes through the gain medium 216. Alternatively, beam path translation can be provided by any of the following six approaches: (1) rotate the first mirror 212A by a small angle in the plane of the paper in FIG. 13A; (2) translate the second mirror 213 by a small distance approximately perpendicular to the axis AA; (3) rotate the second mirror 213 by a small angle in the plane of the paper in FIG. 13A; (4) translate the prism 215 by a small distance approximately perpendicular to the axis AA; (5) rotate the prism 215, about any center except the apex of the prism, by a small angle in the plane of the paper in FIG. 13A; and (6) translate the first mirror 212A approximately parallel to the axis AA.

Figure 13B:
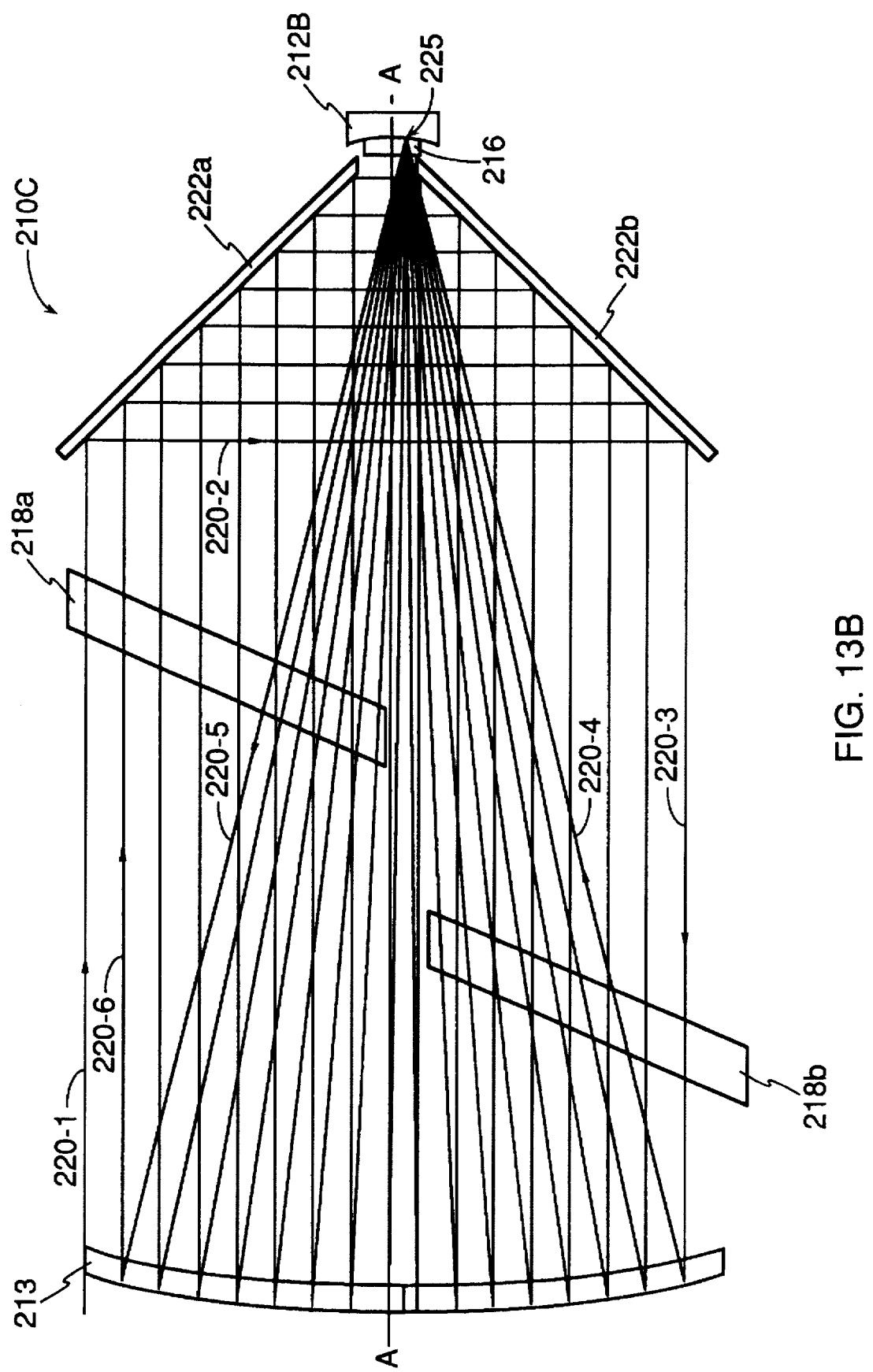
Figure 13C:
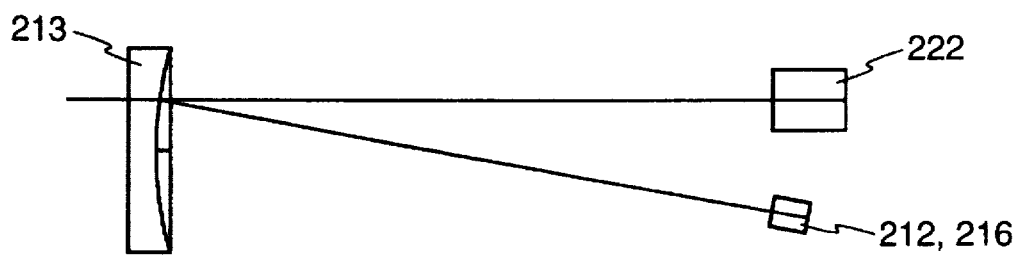

The embodiment 210B shown in FIG. 13C is similar in most respects to the FIG. 13A embodiment, except that: (1) the third and fourth mirror surfaces 214a and 214b and the prism 215 are replaced by two planar mirrors 22a and 22b with the same planar orientation; and (2) the planar first mirror 212A is replaced by a curvilinearly shaped mirror 212B that is contiguous to the gain medium 216. The distance constraints for the embodiment shown in FIG. 13B are the same as the distance constraints shown in FIG. 13A, with the refractive index n being formally set equal to 1. The alternative approaches for beam path translation in FIG. 13A also apply to FIG. 13B.

Figure 14:
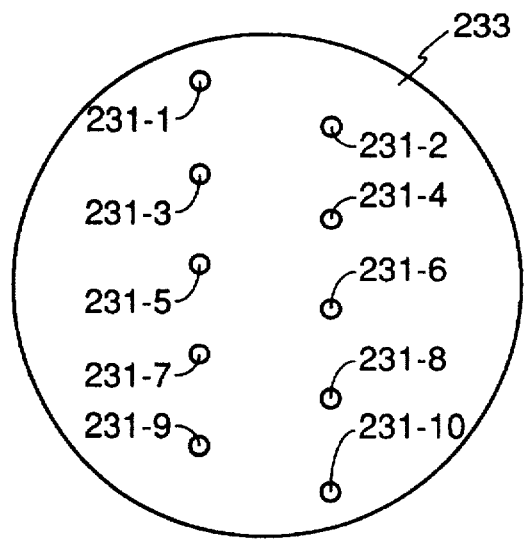
FIG. 14 compares use of two-dimensional and three-dimensional light beam paths in the embodiments.

The embodiments shown in FIGS. 7A–12B have been presented in two-dimensional formats for illustrative purposes. The peregrinating light beams in these embodiments may be confined to a plane, as suggested in these FIGS. However, the light beams shown in any of the FIGS. 7A, 7B, 8A, 8B, 8C, 9A, 9B, 12A, 12B, 13A and 13B may also travel in three-dimensional space, unconfined to a single plane. An example of this is illustrated in the top view of FIG. 13B. FIG. 14 illustrates possible points of passage 231-i(i=1, 2, 3, . . . ) of consecutive light beam segments that propagate parallel to the selected axis AA, through a disk 233 (imaginary) that is oriented transversely to the selected axis AA for any one of these embodiments. In a strictly two-dimensional configuration for that embodiment, the points of beam passage would be 231-1, 231-3, 231-5, etc. Or 231-2, 231-4, 231-6, etc., consistent with confinement of the light beam segments to a single plane.

If the reflective surfaces used in any of the embodiments shown in FIG. 7A–13C (excepting FIGS. 10 and 11 ) are oriented appropriately, the light beam segments will define beam paths in three dimensions, and the points of possible passage through the disk 233 may become 231-1, 231-2, 231-3, 231-4, 231-5, etc., or 231-1, 231-10, 231-3, 231-8, 231-5, 231-6, etc., or some other more complex pattern, possibly involving three or more rows in the disk 233 containing points of beam passage. Thus, the embodiments shown here in FIGS. 7A–13C involve light beams that are confined to a plane or that move in full three-dimensional space.

Figure 15:
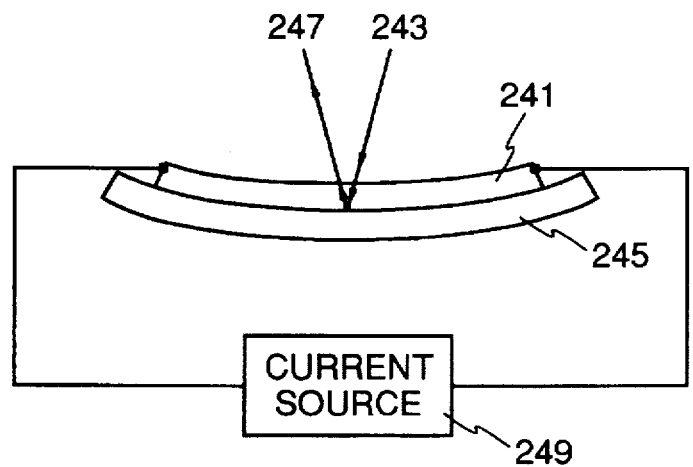
FIG. 15 illustrates one use of an electrically excited gain medium for various embodiments of the invention.

The light amplification gain medium used in any of the FIGS. 1–13C may accept and store photon energy for subsequent transfer to a light beam passing through the gain medium. Alternatively, the gain medium may be a two-dimensional surface array or region of semiconductor elements, containing material such as GAP, GaAs, GaAsP, GaAlAs, AlAs, GaInP, InP, InAsP, InGaAs and InGaAsP. Each semiconductor element accepts and stores electrical energy and releases this stored energy, not as an edge emission, but as a radiative emission (face emission) to a light beam passing through the gain medium in a direction generally transverse to the surface of the semiconductor elements. With reference to FIG. 15, where the gain medium is such a surface array 241 of semiconductor elements, the optical thickness τ of such an element is preferably small and the light beam to be amplified preferably passes through the thin gain medium as an incident beam 243 at approximately perpendicular incidence, is reflected by a reflective surface 245 contiguous to the gain medium, and passes back through the gain medium a second time as a reflected beam 247. The semiconductor surface array 241 can be driven by a pulsed or CW current source 249.

We claim:

1. A multiple pass light amplifier comprising:

an optical gain medium to amplify a light beam having a selected wavelength that passes through the gain medium;

an optical cavity, having a cavity axis, containing the gain medium in one or more segments, and including N reflective surfaces or mirrors (N≧2), consecutively numbered i=1, 2, . . . , N and positioned so that a light beam introduced into the cavity will pass through the gain medium at least one and will be reflected in consecutive order from each mirror once before the light beam is reflected from any one of the mirrors a second time and so that the light beam will execute two or more approximately closed path cycles within the cavity, where the light beam has approximately the same beam diameter each time the beam passes through the gain medium;

beam translation means, positioned between two of the N reflective surfaces so that the translation means does not lie on the cavity axis, for receiving and translating a light beam by a small, controllable amount in a direction approximately perpendicular to the immediately preceding direction of travel of the light beam immediately before the light beam is received by the translation means, so that when the light beam issues from the translation means, the light beam travels substantially parallel to the immediately preceding direction;

light beam insertion means for introducing a light beam produced by a light source into the cavity so that the beam propagates toward one of the mirrors; and light beam removal means for removing a light beam from the cavity.

2. The apparatus of claim 1, further comprising:

one or more laser diodes to provide electromagnetic radiation in a selected wavelength band; and radiation delivery means for receiving electromagnetic radiation produced by the laser diodes and for transporting this radiation to pump said gain medium, the radiation delivery means including at least one of the following: an optical fiber, a lens, a reflective surface, a prism, a waveplate, or a beam splitter.

3. The apparatus of claim 1, wherein one or more of said mirrors includes two or more mirror segments separated from each other.

4. The apparatus of claim 1, wherein said optical gain medium includes a solid-state laser material drawn from the group consisting of Nd:YLF, Nd:YAG, Nd:YVO$_4$, Nd:YOS, Nd:glass, Cr:LiSAF, Cr:LiCAF, Er:glass, Tm:YLF, Tm:YAG, Tm:YVO$_4$, Ho:Tm:YLF, Ho:Tm:YAG, Ho:Tm:YVO$_4$, Yb:YLF, Yb:YAG, Yb:YVO$_4$, Ti:sapphire, ruby and alexandrite.

5. The apparatus of claim 1, wherein said gain medium is a solid, liquid or gas that can be pumped by electromagnetic radiation or by electrical current.

6. The apparatus of claim 1, further comprising an optical gain medium temperature change means, connected to said gain medium, for controllably changing the temperature of said gain medium.

7. The apparatus of claim 1, further comprising optical gain medium pump means for pumping said gain medium longitudinally or pumping said gain medium transversely.

8. The apparatus of claim 1, further comprising defocusing means, positioned adjacent to said gain medium, for controllably reducing the focusing of a light beam incident on said gain medium, to compensate for thermal lensing in said gain medium.

9. The apparatus of claim 1, wherein said beam translation means is a body, of substantially transparent material and having two approximately parallel light-receiving surfaces, that is positioned so that a light beam propagating approximately parallel to said cavity axis and incident on a light-receiving surface of the body, passes through this body is translated a controllable distance toward said cavity axis or away from said cavity axis in a selected first direction.

10. The apparatus of claim 9, wherein said beam translation means further comprises a second body, of substantially transparent material and having two approximately parallel light-receiving surfaces, that is positioned so that a light beam propagating approximately parallel to said cavity axis and incident on a light-receiving surface of the second body, passes through the second body and is translated a controllable distance toward said cavity axis or away from said cavity axis in a second direction that is independent of said first direction.

11. The apparatus of claim 10, wherein said first body and said second body are positioned so that a light beam propagating parallel to said cavity axis that passes through one of said first body and said second body will not pass through the other of said first body and said second body, unless the light beam is first reflected from one of said mirrors.

12. The apparatus of claim 1, wherein at least one of said beam insertion means and said beam removal means includes an aperture in one of said mirrors.

13. The apparatus of claim 1, further comprising a retroreflector positioned to receive a light beam from said beam removal means and to reverse the direction of propagation of this light beam.

14. The apparatus of claim 1, wherein said integer N=2, wherein said optical cavity is a confocal resonator including first and second curvilinearly shaped mirrors facing each other along a resonator axis that coincides with the cavity axis and having a common optical focal point positioned between the mirrors, the two mirrors being arranged so that a light beam that passes through the common focal point is subsequently received by either of the mirrors and is reflected toward the other mirror in a direction that is approximately parallel to the resonator axis, and wherein said gain medium is positioned at the common focal point.

15. The apparatus of claim 14, wherein each of said first and second mirrors is approximately a paraboloidal light-reflecting surface or a spherical light-reflecting surface with a focal point approximately coinciding with said common focal point.

16. The apparatus of claim 14, wherein said first mirror is combined with a lens system, having at least one lens and being positioned between said first mirror and said common focal point so that a light beam leaving said first mirror that passes through the lens system and that passes through the common focal point is subsequently received by said second mirror and is reflected toward said first mirror in a direction that is approximately parallel to the resonator axis.

17. The apparatus of claim 14, wherein said first and second mirrors are approximately identical and are positioned at approximately equal distances from said common focal point.

18. The apparatus of claim 14, wherein said first and second mirrors are positioned at unequal distances from said common focal point.

19. The apparatus of claim 14, further comprising at least one light beam aperture positioned between said first and second mirrors to suppress parasitic oscillations of a light beam amplified by passage through said optical gain medium.

20. The apparatus of claim 1, wherein said integer N≧3 and at least two consecutively numbered mirrors m and m+1 (1≦m≦N−1) are curvilinearly shaped.

21. The apparatus of claim 20, wherein said optical cavity includes a first mirror, a second mirror, a curvilinearly shaped third mirror having a focal length $f_3$, a curvilinearly shaped fourth mirror having a focal length $f_4$, and a fifth mirror, spaced apart and with each mirror facing at least one other mirror, the mirrors being arranged so that a light beam received by the second mirror from the first mirror is reflected toward the third mirror, then reflected by the third mirror toward the fourth mirror in a direction that is approximately parallel to a selected beam propagation direction, then reflected by the fourth mirror toward the fifth mirror, then reflected by the fifth mirror toward the first mirror, then reflected by the first mirror toward the second mirror again to form an optical path for the light beam.

22. The apparatus of claim 21, wherein the optical distance $d_{1,2}$ between said first mirror to said second mirror, the optical distance $d_{2,3}$ between said second mirror and said third mirror, the optical distance $d_{3,4}$ from said third mirror to said fourth mirror, the optical distance $d_{4,5}$ between said fourth mirror to said fifth mirror, and the optical distance $d_{5,1}$ between said fifth mirror and said first mirror satisfy at least one of the following three relations:

$$d_{1,2}+d_{2,3}\cong f_3,$$

$$d_{4,5}+d_{5,1}\cong f_4,$$

$$f_3+f_4\cong d_{3,4}.$$

23. The apparatus of claim 21, wherein said beam path translation means is drawn from the class consisting of the following displacement devices: (1) mirror rotation means for rotating said first mirror, said second mirror and said fifth mirror, or said third mirror and said fourth mirror by a small, controllable angle in the plane defined by a light beam incident on that mirror and a light beam that has been reflected from that mirror; (2) mirror translation means for translating said first mirror a small, controllable distance in a direction approximately perpendicular to said selected direction; (3) mirror translation means for translating said third mirror a small, controllable distance in a direction approximately perpendicular to said selected direction; and (4) mirror translation means for translating said fourth mirror a small, controllable distance in a direction approximately perpendicular to said selected direction.

24. The apparatus of claim 21, wherein said gain medium is positioned between said first minor and said second mirror and is contiguous to said first mirror, and said first mirror is planar.

25. The apparatus of claim 21, wherein said gain medium is positioned between said first mirror and said second mirror and is contiguous to said first mirror, and said first mirror is curvilinearly shaped.

26. The apparatus of claim 21, wherein said fifth mirror is positioned so that any light beam traveling in a direction approximately parallel to said selected direction, which is reflected by said fourth mirror toward said fifth mirror, is reflected by said fifth mirror approximately toward a selected focal point on the reflective surface of said first mirror.

27. The apparatus of claim 21, wherein at least one of said third mirror and said fourth mirror is approximately paraboloidally shaped or approximately spherically shaped.

28. The apparatus of claim 20, wherein all of said mirrors are planar, the apparatus further comprising optical means positioned between two consecutively numbered mirrors and said gain medium, for focusing a light beam that is received after being reflected consecutively from these two consecutively numbered mirrors onto a selected region on a surface or within said gain medium.

29. The apparatus of claim 28, wherein said optical cavity comprises:

first, second, third and fourth mirrors, spaced apart and with each mirror facing at least one other mirror, the mirrors being arranged so that a light beam received by the second mirror from the first mirror is reflected toward the third mirror in a direction that is approximately parallel to a selected beam propagation direction, then is reflected by the third mirror toward the fourth mirror, then is reflected by the fourth mirror toward the first mirror in a direction that is approximately parallel to the selected direction, then is reflected by the first mirror toward the second mirror to form an optical path for the light beam, where the first and second mirrors are oriented approximately perpendicular to each other and the third and fourth mirrors are oriented approximately perpendicular to each other; and first and second lens systems, having respective focal lengths $f_1$ and $f_2$, spaced apart from each other and positioned so that the first lens system lies between the gain medium and the first and second mirrors and so that the second lens system lies between the gain medium and the third and fourth mirrors, where the first lens system receives a light beam travelling away from the second mirror in a direction approximately parallel to the selected direction and reorients the light beam in a direction approximately toward a selected focal point in the gain medium, where the second lens system receives a light beam travelling away from the fourth mirror in a direction approximately parallel to the selected direction and reorients the light beam in a direction approximately toward the selected focal point in the gain medium, and each lens system receives a light beam travelling away from the selected focal point in the gain medium and reorients the light beam in a direction approximately parallel to the selected direction.

30. The apparatus of claim 29, wherein the optical distance $d_{1,L1}$ from said first mirror to said first lens system, the optical distance $d_{2,L1}$ from said second mirror to said first lens system, the optical distance $d_{3,L2}$ from said third mirror to said second lens system, the optical distance $d_{4,L2}$ from said third mirror to said second lens system, the optical distance $d_{1,2}$ from said first mirror to said second mirror, the optical distance $d_{3,4}$ from said third mirror to said fourth mirror, the optical distance $d_{g,L1}$ from said gain medium to said first lens system, and the optical distance $d_{g,L2}$ from said gain medium to said second lens system satisfy at least one of the following four relations:

$$d_{g,L1}\cong f_1,$$

$$d_{g,L2}\cong f_2,$$

$$d_{1,L1}+d_{1,2}+d_{2,L1}\cong 2f_1,$$

$$d_{3,L2}+d_{3,4}+d_{4,L2}\cong 2f_2.$$

31. The apparatus of claim 29, wherein said beam path translation means is an optically transparent plate having two parallel surfaces that is positioned between said second lens system and either said third mirror or said fourth mirror, for receiving and translating a light beam travelling parallel to said selected direction by a small, controllable amount in a direction approximately perpendicular to said selected direction so that, when the light beam issues from the translation means, the light beam travels approximately parallel to said selected direction.

32. The apparatus of claim 29, wherein each of said first and second mirrors are planar, and the planes of the first and second mirrors are oriented approximately perpendicular to each other.

33. The apparatus of claim 29, wherein said first and second mirrors are two internally reflective surfaces on an optically transparent body having at least one additional light beam-receiving surface.

34. The apparatus of claim 29, wherein said beam path translation means is drawn from the class consisting of the following displacement devices: (1) mirror rotation means for rotating said first mirror and said second mirror together by a small, controllable angle in a plane defined by a light beam incident on said first mirror and a light beam that has been reflected from said second mirror; (2) mirror rotation means for rotating said third mirror and said fourth mirror by a small, controllable angle in the plane defined by a light beam incident on that mirror and a light beam that has been reflected from that mirror; (3) lens translation means for translating said first lens system a small, controllable distance in a direction approximately perpendicular to said selected direction; (4) lens translation means for translating said second lens system a small, controllable distance in a direction approximately perpendicular to said selected direction; (5) mirror translation means for translating said first and second mirrors together a small, controllable distance in a direction approximately perpendicular to said selected direction; and (6) mirror translation means for translating said third and fourth mirrors together a small, controllable distance in a direction approximately perpendicular to said selected direction.

35. The apparatus of claim 28, wherein said gain medium is positioned between said first mirror and said second mirror and adjacent to said first mirror, and said optical cavity comprises:

first, second and third mirrors, with the second and third mirrors facing and being spaced apart from the first mirror, the mirrors being arranged so that a light beam received by the second mirror from the first mirror is reflected by the second mirror toward the third mirror, then is reflected by the third mirror toward the first mirror in a direction that is approximately parallel to a selected beam propagation direction and so that a light beam received by the first mirror from the third mirror is reflected by the first mirror toward the second mirror, where the second and third mirrors are oriented approximately perpendicular to each other; and a lens system, having a focal length $f_L$, positioned between the second and third mirrors on one side and the gain medium on the other side, where the lens systems receives a light beam travelling away from the third mirror in a direction approximately parallel to the selected direction and reorients the light beam in a direction approximately toward a selected focal point in the gain medium, and the lens system receives a light beam travelling away from the selected focal point and reorients the light beam so that the light beam travels toward the second mirror in a direction approximately parallel to the selected direction.

36. The apparatus of claim 35, wherein the optical distance $d_{1,L}$ between said first mirror and said lens system, the optical distance $d_{2,L}$ between said second mirror and said lens system, the optical distance $d_{3,L}$ between said third mirror and said lens system, and the optical distance $d_{2,3}$ between said second mirror and said third mirror satisfy at least one of the following two relations:

$$d_{1,L} \cong f_L,$$

$$d_{3,L} + d_{2,3} + d_{2,L} \cong 2f_L.$$

37. The apparatus of claim 35, wherein said beam path translation means is drawn from the class consisting of the following displacement devices: (1) mirror rotation means for rotating said first mirror by a small, controllable angle in the plane defined by a light beam incident on that mirror and a light beam that has been reflected from that mirror; (2) lens translation means for translating said lens system a small, controllable distance in a direction approximately perpendicular to said selected direction; (3) mirror translation means for translating said second mirror and said third mirror together a small, controllable distance in a direction approximately perpendicular to said selected direction; (4) mirror rotation means for rotating said second and third mirrors together by a small, controllable angle in the plane defined by a light beam incident on that mirror and a light beam that has been reflected from that mirror; and (5) mirror translation means for translating said first mirror a small, controllable distance in a direction approximately parallel to said selected direction.

38. The apparatus of claim 35, wherein said second and third mirrors are planar and these two mirror planes are oriented approximately perpendicular to each other.

39. The apparatus of claim 35, wherein said second and third mirrors are two internally reflective surfaces on an optically transparent body having at least one additional light beam-receiving surface.

40. The apparatus of claim 1, wherein said gain medium comprises:

an activatable array of one or more face emitting semiconductor diodes, oriented to receive said light beam at a first face of the array at approximately perpendicular incidence, to pass said light beam through the diode array to a second face of the array that faces and is spaced apart from the first face, and to amplify said light beam as said light beam passes through the array; and a controllable current source connected to the diode array to provide electrical current to activate the diode array.

41. The apparatus of claim 40, wherein the semiconductor material for said semiconductor diodes is drawn from the group consisting of GaP, GaAs, GaAsP, GaAlAs, AlAs, GaInP, InP, InAsP, InGaAs and InGaAsP.

42. The apparatus of claim 40, further including a reflective surface, positioned adjacent to said second face of said diode array, that receives and reflects said light beam and causes said light beam to pass through said array a second time, from said second face toward said first face of said array.

43. A multiple pass light amplifier comprising:

an optical gain medium to amplify a light beam having a selected wavelength that passes through the gain medium;

an optical cavity containing the gain medium and including N reflective surfaces or mirrors (N≧3), consecutively numbered i=1, 2, . . . , N and positioned so that a light beam introduced into the cavity will be reflected from each mirror in consecutive order and will pass through the gain medium at least once, then will be reflected from at least one of the mirrors numbered 2, ..., N a second time before the light beam is reflected from mirror number 1 a second time and so that the light beam will execute two or more approximately closed path cycles within the cavity, where the light beam has approximately the same beam diameter each time the beam passes through the gain medium;

beam translation means, positioned between two of the N reflective surfaces so that the translation means does not lie on the cavity axis, for receiving and translating a light beam by a small, controllable amount in a direction approximately perpendicular to the immediately preceding direction of travel of the light beam immediately before the light beam is received by the translation means, so that, when the light beam issues from the translation means, the light beam travels substantially parallel to the immediately preceding direction;

light beam insertion means for introducing a light beam produced by a light source into the cavity so that the beam propagates toward one of the mirrors; and light beam removal means for removing a light beam from the cavity.

44. The apparatus of claim 43, further comprising:

one or more laser diodes to provide electromagnetic radiation in a selected wavelength band; and radiation delivery means for receiving electromagnetic radiation produced by the laser diodes and for transporting this radiation to pump said gain medium, the radiation delivery means including at least one of the following: an optical fiber, a lens, a reflective surface, a prism, a waveplate, or a beam splitter.

45. The apparatus of claim 43, wherein one or more of said mirrors includes two or more mirror segments separated from each other.

46. The apparatus of claim 43, wherein said optical gain medium includes a solid-state laser material drawn from the group consisting of Nd:YLF, Nd:YAG, Nd:YVO$_4$, Nd:YOS, Nd:glass, Cr:LiSAF, Cr:LiCAF, Er:glass, Tm:YLF, Tm:YAG, Tm:YVO$_4$, Ho:Tm:YLF, Ho:Tm:YAG, Ho:Tm:YVO$_4$, Yb:YLF, Yb:YAG, Yb:YVO$_4$, Ti:sapphire, ruby and alexandrite.

47. The apparatus of claim 43, wherein said gain medium is a solid, liquid or gas that can be pumped by electromagnetic radiation or by electrical current.

48. The apparatus of claim 43, further comprising an optical gain medium temperature change means, connected to said gain medium, for controllably changing the temperature of said gain medium.

49. The apparatus of claim 43, further comprising optical gain medium pump means for pumping said gain medium longitudinally or pumping said gain medium transversely.

50. The apparatus of claim 43, further comprising defocusing means, positioned adjacent to said gain medium, for controllably reducing the focusing of a light beam incident on said gain medium, to compensate for thermal lensing in said gain medium.

51. The apparatus of claim 43, wherein said beam translation means is a body, of substantially transparent material and having two approximately parallel light-receiving surfaces, that is positioned so that a light beam propagating approximately parallel to said cavity axis and incident on a light-receiving surface of the body, passes through this body is translated a controllable distance toward said cavity axis or away from said cavity axis in a selected first direction.

52. The apparatus of claim 51, wherein said beam translation means further comprises a second body, of substantially transparent material and having two approximately parallel light-receiving surfaces, that is positioned so that a light beam propagating approximately parallel to said cavity axis and incident on a light-receiving surface of the second body, passes through the second body and is translated a controllable distance toward said cavity axis or away from said cavity axis in a second direction that is independent of said first direction.

53. The apparatus of claim 52, wherein said first body and said second body are positioned so that a light beam propagating parallel to said cavity axis that passes through one of said first body and said second body will not pass through the other of said first body and said second body, unless the light beam is first reflected from one of said mirrors.

54. The apparatus of claim 43, wherein at least one of said beam insertion means and said beam removal means includes an aperture in one of said mirrors.

55. The apparatus of claim 43, further comprising a retro-reflector positioned to receive a light beam from said beam removal means and to reverse the direction of propagation of this light beam.

56. The apparatus of claim 43, wherein said gain medium is spaced apart from each of said mirrors.

57. The apparatus of claim 43, wherein said gain medium is adjacent to or contiguous to said mirror number 1.

58. The apparatus of claim 43, wherein all of said mirrors are curvilinearly shaped.

59. The apparatus of claim 43, wherein said mirror number 2 is curvilinearly shaped.

60. The apparatus of claim 59, wherein all of said mirrors except said mirror number 2 are planar.

61. The apparatus of claim 59, wherein at least two consecutively numbered mirrors m and m+1 ($1 < m \leq N-1$) are curvilinearly shaped.

62. The apparatus of claim 59, where said optical cavity comprises a first mirror, a curvilinearly shaped second mirror, a third mirror and fourth mirror, spaced apart and with each mirror facing at least one other mirror, the mirrors being arranged so that a light beam received by the second mirror from the first mirror is reflected toward the third mirror in a direction that is approximately parallel to a selected beam propagation direction, then reflected by the third mirror toward the fourth mirror, then reflected by the fourth mirror toward the second mirror, then reflected by the second mirror toward the first mirror, then reflected by the first mirror toward the second mirror again to form an optical path for the light beam.

63. The apparatus of claim 59, wherein said second mirror is a paraboloidal light-reflecting surface or a spherical light-reflecting surface with a focal point approximately coinciding with said common focal point.

64. The apparatus of claim 62, wherein the focal length $f_2$ of said second mirror, the optical distance $d_{1,2}$ between said first mirror and said second mirror, the optical distance $d_{2,3}$ between said second mirror and said third mirror, the optical distance $d_{3,4}$ between said third mirror and said fourth mirror, and the optical distance $d_{4,2}$ between said fourth mirror and said second mirror satisfy at least one of the following two relations:

$$d_{1,2} \cong f_2,$$

$$d_{2,3} + d_{3,4} + d_{2,4} \cong 2f_2.$$

65. The apparatus of claim 62, wherein said beam path translation means is an optically transparent plate having two parallel surfaces, positioned between said second and third mirrors or between said second and fourth mirrors, for receiving and translating a light beam travelling parallel to said selected direction by a small, controllable amount in a direction approximately perpendicular to said selected direction so that, when the light beam issues from the translation means, the light beam travels approximately parallel to said selected direction.

66. The apparatus of claim 62, wherein said beam path translation means is drawn from the class consisting of the following displacement devices: (1) mirror rotation means for rotating said first mirror by a small, controllable angle in the plane defined by a light beam incident on said first mirror and a light beam that has been reflected from said first mirror; (2) mirror rotation means for rotating said second mirror by a small, controllable angle in the plane defined by a light beam incident on said second mirror and a light beam that has been reflected from said second mirror; (3) mirror rotation means for rotating said third and fourth mirrors together by a small, controllable angle in the plane defined by a light beam incident on said first mirror and a light beam that has been reflected from said first mirror; (4) mirror translation means for translating said first mirror a small, controllable distance in a direction approximately perpendicular to said selected direction; and (5) mirror translation means for translating at least one of said third mirror and said fourth mirror a small, controllable distance in a direction approximately perpendicular to said selected direction.

67. The apparatus of claim 62, wherein said second mirror is positioned so that any light beam received by said second mirror from said fourth mirror in a direction approximately parallel to said selected direction is reflected approximately toward a selected focal point on the reflective surface of said first mirror.

68. The apparatus of claim 67, wherein said second mirror is approximately paraboloidally shaped or approximately spherically shaped.

69. The apparatus of claim 62, wherein said third and fourth mirrors are spaced apart from each other by a small distance and form an aperture therebetween and said light beam insertion means comprises this aperture.

70. The apparatus of claim 62, wherein said third and fourth mirrors are spaced apart from each other by a small distance and form an aperture therebetween and said light beam removal means comprises this aperture.

71. The apparatus of claim 61, wherein said optical cavity includes a first mirror, a curvilinearly shaped second mirror, a curvilinearly shaped third mirror and fourth mirror, spaced apart and with each mirror facing at least one other mirror, the mirrors being arranged so that a light beam received by the second mirror from the first mirror is reflected toward the third mirror in a direction that is approximately parallel to said selected beam propagation direction, then reflected by the third mirror toward the fourth mirror, then reflected by the fourth mirror toward the third mirror, then reflected by the third mirror toward the second mirror in a direction that is approximately parallel to said selected direction, then reflected by the second mirror toward the first mirror, then reflected by the first mirror toward the second mirror again to form an optical path for the light beam.

72. The apparatus of claim 71, wherein the focal length $f_2$ of said second mirror, the focal length $f_3$ of said third mirror, the optical distance $d_{1,2}$ between said first mirror and said second mirror, the optical distance $d_{2,3}$ between said second mirror and said third mirror, and the optical distance $d_{3,4}$ between said third mirror and said fourth mirror satisfy at least one of the following three relations:

$$d_{1,2} \cong f_2,$$

$$d_{3,4} \cong f_3$$

$$(d_{2,3}+d_{4,2})/2 \cong f_2+f_3.$$

73. The apparatus of claim 71, wherein said beam path translation means is an optically transparent plate having two parallel surfaces, positioned between said second and third mirrors, for receiving and translating a light beam travelling parallel to said selected direction by a small, controllable amount in a direction approximately perpendicular to said selected direction so that, when the light beam issues from the translation means, the light beam travels approximately parallel to said selected direction.

74. The apparatus of claim 71, wherein said beam path translation means is drawn from the class consisting of the following displacement devices: (1) mirror rotation means for rotating said first mirror by a small, controllable angle in the plane defined by a light beam incident on said first mirror and a light beam that has been reflected from said first mirror; (2) mirror rotation means for rotating said second mirror by a small, controllable angle in the plane defined by a light beam incident on said second mirror and a light beam that has been reflected from said second mirror; (3) mirror rotation means for rotating said third mirror by a small, controllable angle in the plane defined by a light beam incident on said third mirror and a light beam that has been reflected from said third mirror; (4) mirror rotation means for rotating said fourth mirror by a small, controllable angle in the plane defined by a light beam incident on said fourth mirror and a light beam that has been reflected from said fourth mirror; (5) mirror translation means for translating said first mirror a small, controllable distance in a direction approximately perpendicular to said selected direction; (6) mirror translation means for translating said second mirror a small, controllable distance in a direction approximately perpendicular to said selected direction; (7) mirror translation means for translating said third mirror a small, controllable distance in a direction approximately perpendicular to said selected direction; and (8) mirror translation means for translating said fourth mirror a small, controllable distance in a direction approximately perpendicular to said selected direction.

75. The apparatus of claim 71, wherein at least one of said second mirror and said third mirror is either paraboloidally shaped or spherically shaped.

76. The apparatus of claim 59, wherein said optical cavity includes first, second, third and fourth mirrors, with the second mirror being curvilinearly shaped and being spaced apart from and facing the first, third and fourth mirrors, where the third and fourth mirrors are oriented approximately perpendicular to each other;

where the third and fourth mirrors are positioned so that a light beam received by the third mirror from the second mirror in a direction that is approximately parallel to a selected beam propagation direction, is reflected by the third mirror toward the fourth mirror, then is reflected by the fourth mirror toward the second mirror in a direction that is approximately parallel to the selected direction; and where the second mirror is positioned so that a light beam traveling approximately in the selected direction is reflected by the second mirror toward a selected focal point on the first mirror or in the gain medium.

77. The apparatus of claim 76, wherein the focal length $f_2$ of said second mirror, the optical distance $d_{1,2}$ between said first mirror and said second mirror, the optical distance $d_{2,3}$ between said second mirror and said third mirror, the optical distance $d_{3,4}$ between said third mirror and said fourth mirror, the optical distance $d_{4,2}$ between said fourth mirror and said second mirror, and the weighted average refractive index n of a material positioned between said first mirror and said second mirror satisfy at least one of the following two relations:

$$d_{1,2} \cong f_2,$$

$$(d_{2,3}+d_{3,4}+d_{4,2})/n \cong 2f_2.$$

78. The apparatus of claim 76, wherein said beam path translation means is an optically transparent plate having two parallel surfaces, positioned between said second mirror and said third mirror, or between said second mirror and said fourth, for receiving and translating a light beam travelling parallel to said selected direction by a small, controllable amount in a direction approximately perpendicular to said selected direction so that, when the light beam issues from the translation means, the light beam travels approximately parallel to said selected direction.

79. The apparatus of claim 76, wherein said beam path translation means is drawn from the class consisting of the following displacement devices: (1) mirror rotation means for rotating said first mirror by a small, controllable angle in the plane defined by a light beam incident on said first mirror and a light beam that has been reflected from said first mirror; (2) mirror rotation means for rotating said second mirror by a small, controllable angle in the plane defined by a light beam incident on said second mirror and a light beam that has been reflected from said second mirror; (3) mirror rotation means for rotating said third mirror by a small, controllable angle in the plane defined by a light beam incident on said third mirror and a light beam that has been reflected from said third mirror; (4) mirror rotation means for rotating said fourth mirror by a small, controllable angle in the plane defined by a light beam incident on said fourth mirror and a light beam that has been reflected from said fourth mirror; (5) mirror translation means for translating said first mirror a small, controllable distance in a direction approximately parallel to said selected direction; (6) mirror translation means for translating said second mirror a small, controllable distance in a direction approximately perpendicular to said selected direction; and (7) mirror translation means for translating said third and fourth mirrors together a small, controllable distance in a direction approximately perpendicular to said selected direction.

80. The apparatus of claim 76, wherein said third and fourth mirrors are two internally reflective surfaces on an optically transparent body having at least one additional light beam-receiving surface.

81. The apparatus of claim 43, wherein said gain medium comprises:
an activatable array of one or more face emitting semiconductor diodes, oriented to receive said light beam at a first face of the array at approximately perpendicular incidence, to pass said light beam through the diode array to a second face of the array that faces and is spaced apart from the first face, and to amplify said light beam as said light beam passes through the array; and
a controllable current source connected to the diode array to provide electrical current to activate the diode array.

82. The apparatus of claim 81, wherein the semiconductor material for said semiconductor diodes is drawn from the group consisting of GaP, GaAs, GaAsP, GaAlAs, AlAs, GaInP, InP, InAsP, InGaAs and InGaAsP.

83. The apparatus of claim 81, further including a reflective surface, positioned adjacent to said second face of said diode array, that receives and reflects said light beam and causes said light beam to pass through said array a second time, from said second face toward said first face of said array.

84. A multiple-pass light amplifier comprising:
a confocal resonator including first and second curvilinearly shaped mirrors facing each other along a resonator axis and having a common optical focal point positioned between the mirrors, the two mirrors being arranged so that a light beam that passes through the common focal point is subsequently received by either of the mirrors and is reflected toward the other mirror in a direction that is approximately parallel to the resonator axis;
an optical gain medium, having a diameter that is small compared the distance between the two mirrors and being positioned at the common focal point of the two mirrors;
beam translation means, positioned between two of the mirrors so that the translation means does not lie on the cavity axis, for receiving and translating a light beam by a small, controllable amount in a direction approximately perpendicular to the immediately preceding direction of travel of the light beam immediately before the light beam is received by the translation means, so that, when the light beam issues from the translation means, the light beam travels substantially parallel to the immediately preceding direction;
light beam insertion means for introducing a light beam produced by the light source into the region between the first and second mirrors; and
light beam removal means for removing a light beam from the region between the first and second mirrors,
whereby a light beam introduced into the region between the first and second mirrors has approximately the same diameter each time the beam passes through the gain medium.

* * * * *